(12) United States Patent
Huang et al.

(10) Patent No.: US 12,439,765 B2
(45) Date of Patent: Oct. 7, 2025

(54) COMPOUND, PREPARATION METHOD AND USE THEREOF AND PEROVSKITE SOLAR CELL CONTAINING SAME

(71) Applicant: CONTEMPORARY AMPEREX TECHNOLOGY (HONG KONG) LIMITED, Hong Kong (CN)

(72) Inventors: Zhihan Huang, Ningde (CN); Weifeng Liang, Ningde (CN); Ruoxuan Shi, Ningde (CN); Bo Xu, Ningde (CN)

(73) Assignee: CONTEMPORARY AMPEREX TECHNOLOGY (HONG KONG) LIMITED, Hong Kong (CN)

(*) Notice: Subject to any disclaimer, the term of this patent is extended or adjusted under 35 U.S.C. 154(b) by 79 days.

(21) Appl. No.: 18/595,150

(22) Filed: Mar. 4, 2024

(65) Prior Publication Data
US 2024/0292639 A1  Aug. 29, 2024

Related U.S. Application Data

(63) Continuation of application No. PCT/CN2022/107338, filed on Jul. 22, 2022.

(51) Int. Cl.
*H10K 30/86* (2023.01)
*C07C 213/00* (2006.01)
(Continued)

(52) U.S. Cl.
CPC ............ *H10K 30/86* (2023.02); *C07C 213/00* (2013.01); *C07C 213/08* (2013.01);
(Continued)

(58) Field of Classification Search
CPC .... H10K 30/86; H10K 85/636; H10K 85/655; H10K 85/63; H10K 2101/30;
(Continued)

(56) References Cited

U.S. PATENT DOCUMENTS 5,508,136 A * 4/1996 Shirota ................. C07C 211/54
430/73
2002/0006528 A1  1/2002 Heuer et al.
(Continued)

FOREIGN PATENT DOCUMENTS

| CN | 101253145 A | 8/2008 |
| CN | 110776434 A | 2/2020 |

OTHER PUBLICATIONS

CN 101253145 A English machine translation (Year: 2008).*
(Continued)

*Primary Examiner* — Andrew J Golden
(74) *Attorney, Agent, or Firm* — Ladas & Parry LLP

(57) ABSTRACT

The present disclosure provides a compound having a structure of formula (I), where R1 and R2 are defined in the specification. In addition, the present disclosure further provides a preparation method and use of the compound of formula (I), in particular to a perovskite solar cell including the compound of formula (I). This compound as a hole transport material has the advantages in that the use of additives can be avoided, thereby improving the photoelectric conversion efficiency and stability of the cell.

(Continued)

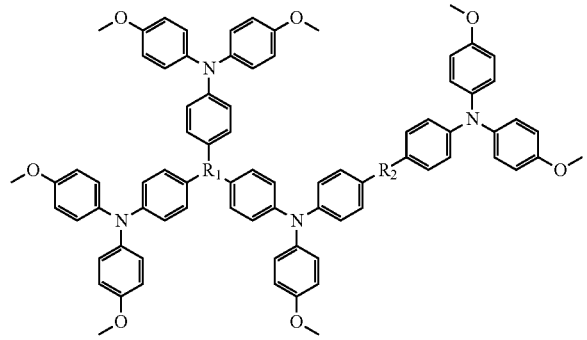

(I)

11 Claims, 1 Drawing Sheet

(51) Int. Cl.
*C07C 213/08* (2006.01)
*C07C 217/92* (2006.01)
*C07D 333/20* (2006.01)
*H10K 30/40* (2023.01)
*H10K 85/60* (2023.01)
*H10K 101/30* (2023.01)

(52) U.S. Cl.
CPC .......... *C07C 217/92* (2013.01); *C07D 333/20* (2013.01); *H10K 30/40* (2023.02); *H10K 85/631* (2023.02); *H10K 85/636* (2023.02); *H10K 85/655* (2023.02); *H10K 2101/30* (2023.02)

(58) Field of Classification Search
CPC ... C07C 213/00; C07C 213/08; C07C 217/92; C07D 333/20
See application file for complete search history.

(56) References Cited

U.S. PATENT DOCUMENTS

2002/0090532 A1 7/2002 Heuer et al.
2015/0311440 A1 10/2015 Seok et al.

OTHER PUBLICATIONS

ISR for International Application PCT/CN2022/107338 mailed Dec. 16, 2022.
Written Opinion for International Application PCT/CN2022/107338 mailed Dec. 16, 2022.
Extended European Search Report for Application No. 22950448.5, mailed Feb. 6, 2025, 7 pages.
Liu Y, et al., Hexa-substituted benzene derivatives as hole transporting materials for efficient perovskite solar cells, Dyes and Pigments (2019), doi: https://doi.org/10.1016/j.dyepig.2018.12.010, 23 pages.

* cited by examiner

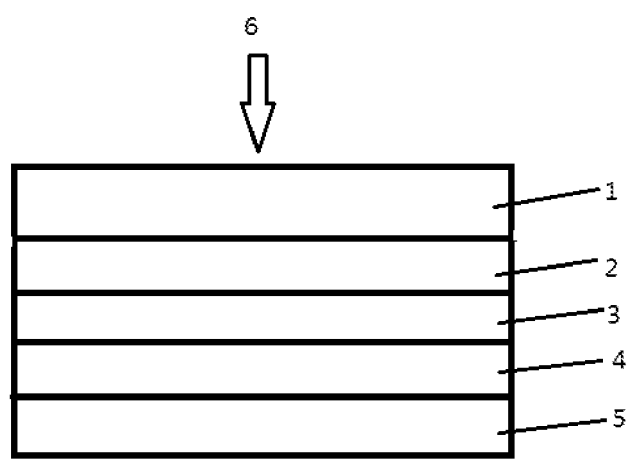

COMPOUND, PREPARATION METHOD AND USE THEREOF AND PEROVSKITE SOLAR CELL CONTAINING SAME

CROSS-REFERENCE TO RELATED APPLICATIONS

This application is a continuation of International application PCT/CN2022/107378 filed on Jul. 22, 2022. The subject matter of these applications is incorporated herein by reference in its entirety.

FIELD

The present disclosure relates to the technical field of perovskite solar cells, and more particularly, to a new compound, and a preparation method and use thereof, in particular to a perovskite solar cell containing the compound.

BACKGROUND

With the continuous development of the global economy and society, the demand for energy in human society is increasing. However, due to overexploitation and increasing environmental damage, traditional fossil energy has been difficult to meet the needs of the economy and society. Solar energy has attracted more and more attention because of its renewable and pollution-free advantages. Perovskite solar cells have broad development prospects due to their simple production process, low cost and good photoelectric conversion efficiency.

In the perovskite solar cells, a hole transport layer is an important component, which plays a key role in the photoelectric conversion efficiency of the cells. At present, the hole transport layer usually includes a hole transport material (HTM) and additives, but such composition is not conducive to the long-term stable operation of perovskite solar cells. Therefore, further research and improvement of hole transport materials are still needed.

SUMMARY

The present disclosure is conducted in view of the above subject, the purpose of which is to provide a new compound having a deeper HOMO energy level and a higher hole mobility, thereby improving the photoelectric conversion efficiency and stability of light-emitting devices, in particular perovskite solar cells.

To achieve the above purpose, the present disclosure provides a compound having a structure of formula (I),

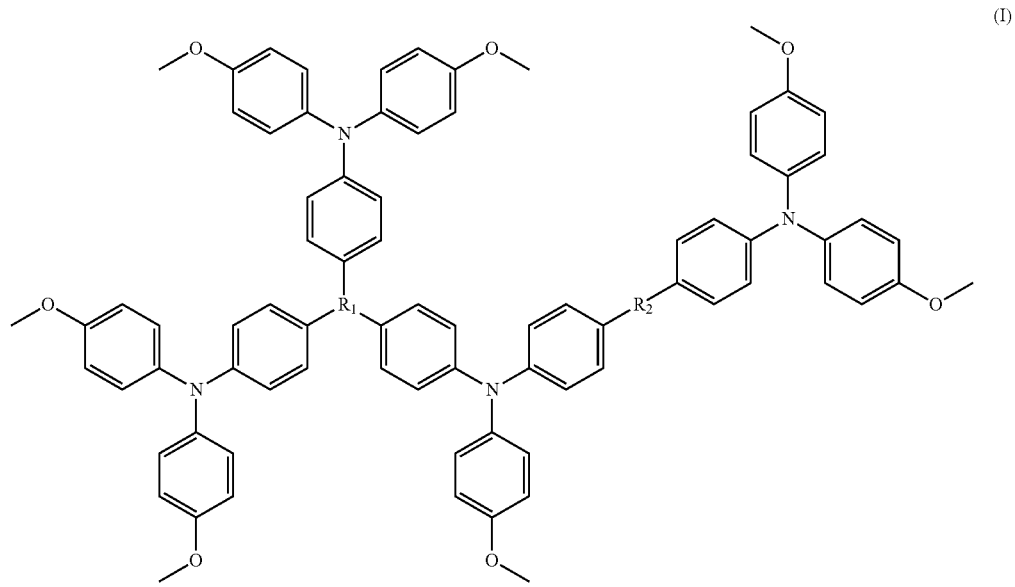

where R1 is trivalent phenyl, optionally 1,3,4-benzenetriyl;

R2 is a single bond, $C_2$-$C_6$ conjugated alkenylene or an unsaturated 5-membered or 6-membered ring group containing heteroatoms selected from O, S, or Se; and optionally, R2 is single bond, vinylidene, furylidene, thiophenylene or selenophenylene.

By using the trivalent R1 group and the divalent R2 group, four triphenylamine groups are connected to form a new structural arrangement. Therefore, its HOMO energy level is more compatible with a HOMO energy level of a perovskite layer, and the hole mobility is significantly improved, so that the use of additives in the preparation of a hole transport layer can be avoided, so as to further improve the photoelectric conversion efficiency and stability of light-emitting devices, in particular perovskite solar cells.

In an embodiment, the compound of the present disclosure refers to a compound of formula (I-1), formula (I-2) or formula (I-3),

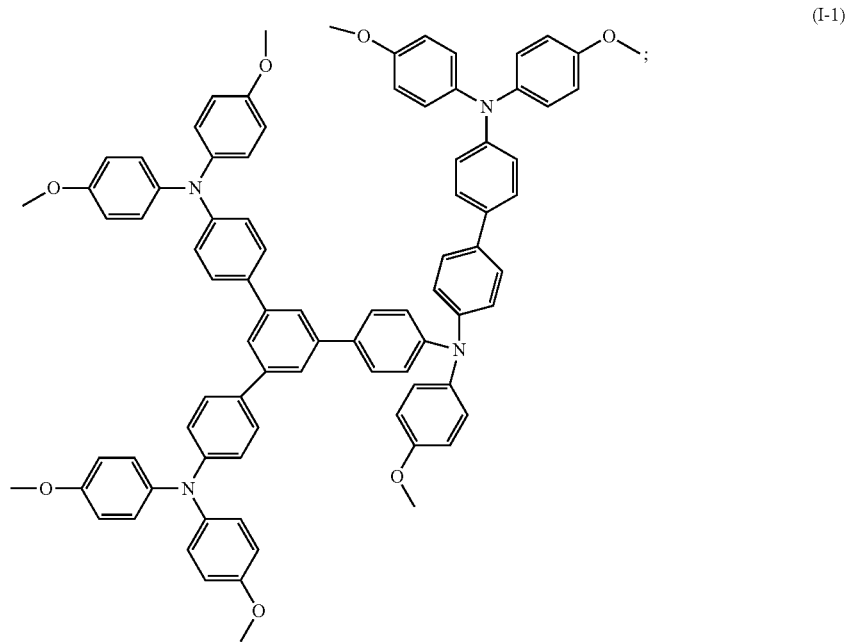
(I-1)
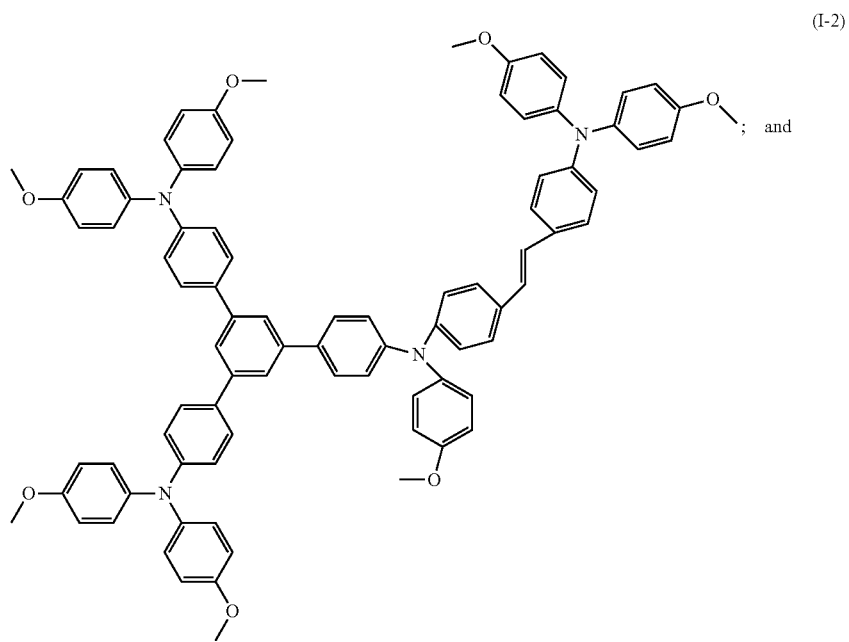
(I-2); and

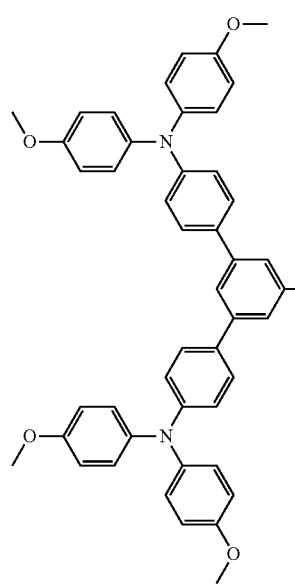

(I-3)

These specific compounds are applied to the hole transport layer, which can further improve the stability and photoelectric conversion efficiency of light-emitting devices.

In an embodiment, the compound of formula (I) of the present disclosure has a HOMO energy level of −5.05 eV to −5.30 eV, optionally −5.1 eV to −5.2 eV, and a charge mobility of $1.0\times10^{-4}$ $cm^2V^{-1}$ $s^{-1}$ to $8.0\times10^{-4}$ $cm^2V^{-1}s^{-1}$, optionally $2.0\times10^{-4}$ $cm^2V^{-1}s^{-1}$ to $6.0\times10^{-4}$ $cm^2V^{-1}s^{-1}$.

A second aspect of the present disclosure provides a preparation method of a compound of formula (I). The method includes the following steps:

Step 1: preparing a compound of formula (II):

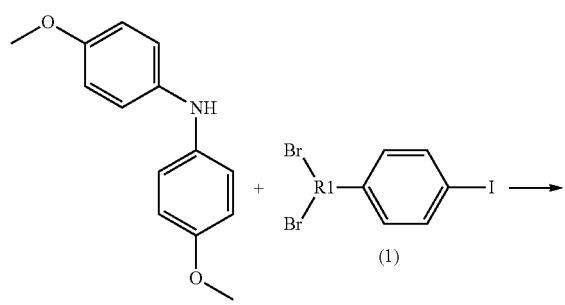

(1)

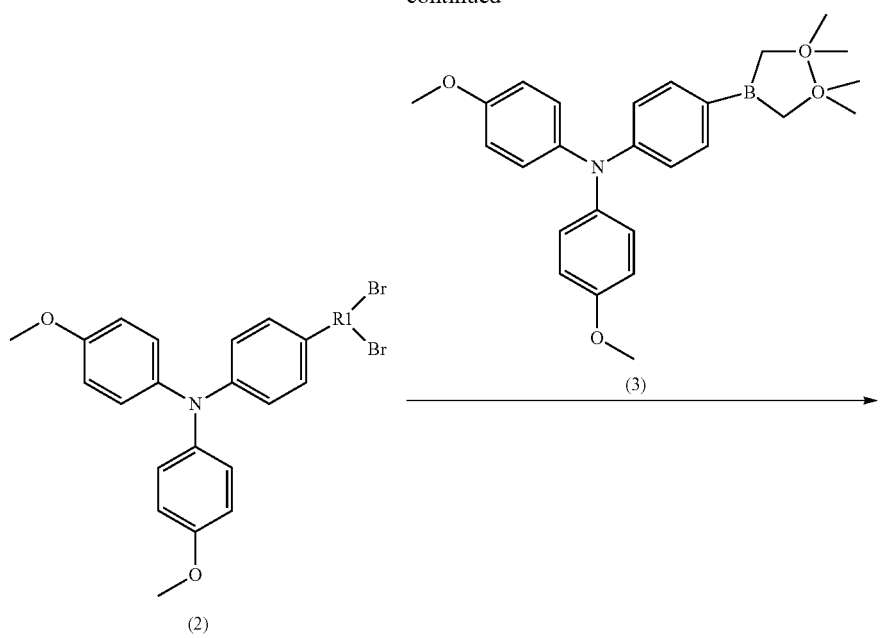
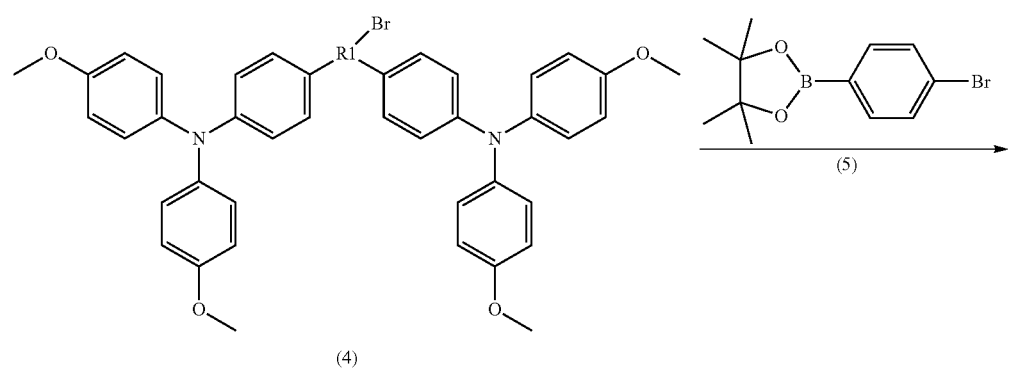
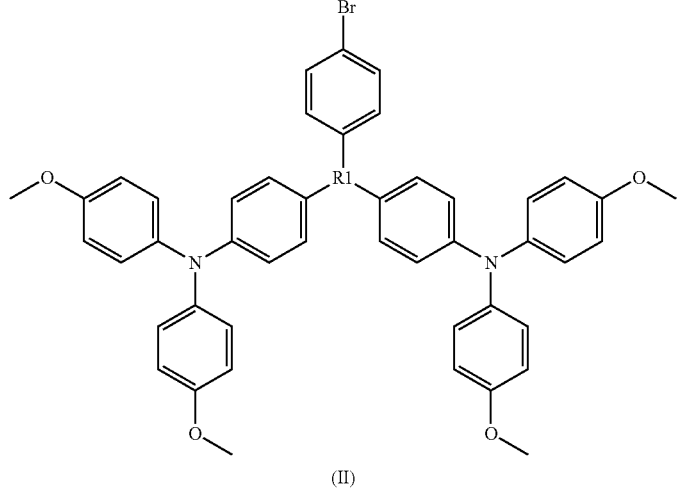

4,4'-dimethoxydiphenylamine and an iodobenzene dibromide of formula (1) undergo a coupling reaction to form an intermediate (2), the intermediate (2) and 4-borate-4',4'-dimethoxytriphenylamine of formula (3) undergo a coupling reaction to generate an intermediate (4), and the intermediate (4) and 2-(4-bromophenyl)-4,4,5,5-tetramethyl-1,3,2-dioxaborolane of formula (5) undergo a coupling reaction to obtain the compound of formula (II);

Step 2: preparing a compound of formula (III):

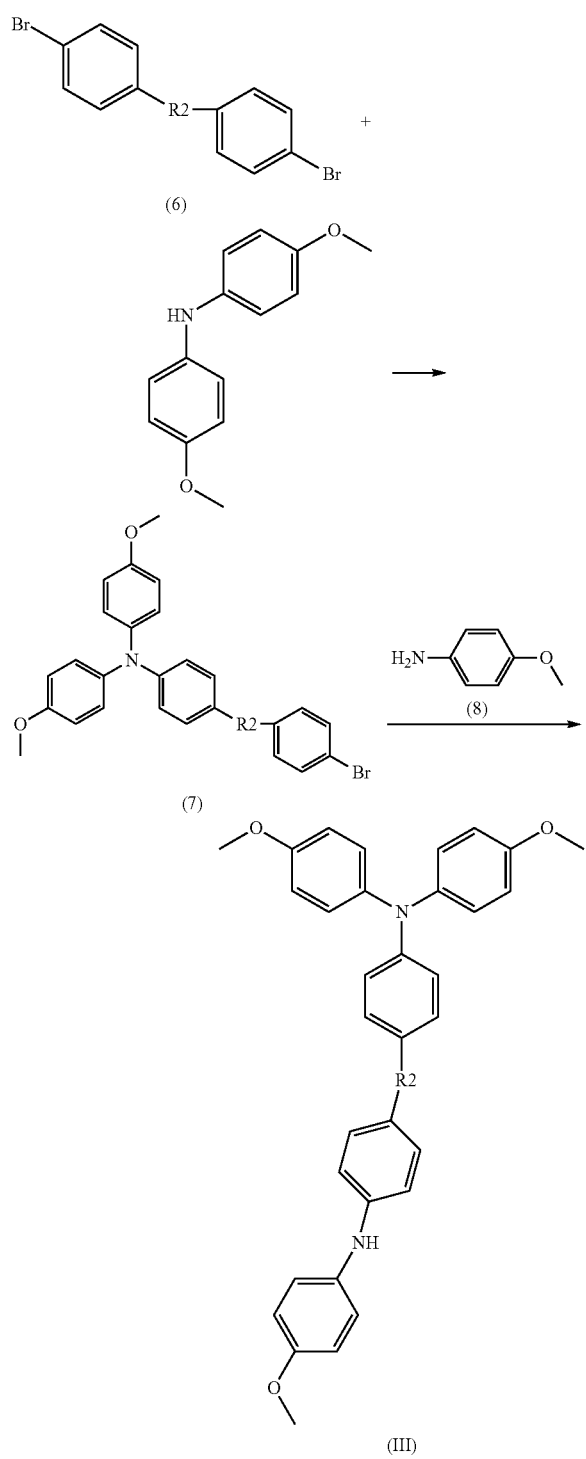

4,4'-dimethoxydiphenylamine and a compound of formula (6) undergo a coupling reaction to form an intermediate (7), and the intermediate (7) and p-methoxyaniline of formula (8) undergo a coupling reaction to generate the compound of formula (III); and Step 3: preparing of a compound of formula (I):

the compound of formula (II) and the compound of formula (III) undergo a coupling reaction in the presence of a palladium catalyst and an alkali to obtain the compound of formula (I).

The above preparation method has the advantages of high yield and low cost.

A third aspect of the present disclosure provides uses of the compound of formula (I) described in the first aspect of the present disclosure and the compound of formula (I) obtained according to the preparation method described in the second aspect of the present disclosure, and use of the compound of formula (I) as a hole transport material in a light-emitting device. The light-emitting device includes an organic electroluminescent device, and a perovskite solar cell. As a result, the light-emitting device with improved photoelectric conversion efficiency and stability is obtained.

In an embodiment, the perovskite solar cell of the present disclosure includes a conductive glass, an electron transport layer, a perovskite layer, a hole transport layer, and a metal electrode. The hole transport layer includes the compound of formula (I) described in the first aspect of the present disclosure or the compound of formula (I) obtained according to the preparation method described in the second aspect of the present disclosure. As a result, the perovskite solar cell with good photoelectric conversion efficiency and stability is obtained.

In an embodiment, in the perovskite solar cell of the present disclosure, the hole transport layer contain no additives. The additives are selected from lithium salts, cobalt salts, or co-solvents, including one or more of bis(trifluoromethane) sulfonimide lithium salt (Li-TFSI), cobalt-base (III)bis-trifluoromethane sulfonimide salt (FK209, Co(III) TFSI), and 4-tert-butylpyridine (tBP). Therefore, the problems caused by the use of additives can be avoided, and the photoelectric conversion efficiency and stability of the perovskite cell can be further improved.

In an embodiment, in the perovskite solar cell of the present disclosure, the hole transport layer has a HOMO energy level of −5.05 eV to −5.30 eV, optionally −5.1 eV to −5.2 eV; and the perovskite layer has a valence band top energy level of −5.30 eV to −5.60 eV, optionally −5.30 eV to −5.50 eV.

In an embodiment, in the perovskite solar cell of the present disclosure, the HOMO energy level of the hole transport layer is greater than the valence band top energy level of the perovskite layer, with an energy level difference of 0.35 eV to 0.05 eV, optionally 0.3 eV to 0.2 eV.

In an embodiment, in the perovskite solar cell of the present disclosure, the thickness of the hole transport layer is 5 nm to 100 nm, optionally 30 nm to 80 nm. When the hole transport layer includes the compound of formula (I) of the present disclosure, and its thickness is within the above range, the hole transport layer can not only play the role of extracting and transporting holes, but also help to block the invasion of external water and oxygen, thereby improving the long-term operation stability of the perovskite solar cell.

In an embodiment, a preparation method of the perovskite solar cell of the present disclosure includes a preparation step of the hole transport layer:

the compound of formula (I) described in the first aspect of the present disclosure and the compound of formula (I) obtained according to the preparation method described in the second aspect of the present disclosure are dissolved in an organic solvent to prepare a solution of a hole transport material; then, the solution of the hole transport material is coated onto the surface of the perovskite layer, and the solvent is removed to obtain the hole transport layer;

when the perovskite solar cell is a forward perovskite solar cell, the concentration of the compound of formula (I) in the solution of the hole transport material is 20-100 mg/mL; when the perovskite solar cell is an inverted perovskite solar cell, the concentration of the compound of formula (I) in the solution of the hole transport material is 1-50 mg/ml; and the organic solvent is toluene, chlorobenzene or dichloromethane.

The compound of formula (I) provided in the present disclosure has a HOMO energy level matching with the perovskite layer energy level, and high hole mobility, and can avoid the use of additives when applied to the hole transport layer, thereby obtaining the perovskite solar cell with significantly improved photoelectric conversion efficiency and stability.

BRIEF DESCRIPTION OF THE DRAWINGS

FIG. 1 is a schematic structural diagram of a forward perovskite solar cell in one embodiment of the present disclosure.

1—Conductive glass; 2—electron transport layer; 3—perovskite layer; 4—hole transport layer; 5—metal electrode; and 6—incident light.

DETAILED DESCRIPTION

Embodiments of a compound of formula (I) of the present disclosure and a perovskite solar cell including the compound of formula (I) are appropriately described in detail below with reference to accompanying drawings. But there will be cases where unnecessary details are omitted. For example, there are cases where detailed descriptions of already well-known matters and duplicative statements of the actual same structure are omitted. This is to avoid the following description from becoming unnecessary lengthy, and to facilitate the understanding of those skilled in the art. Further, the accompanying drawings and the following descriptions are provided for the full understanding of the present disclosure by those skilled in the art and are not intended to limit the subject matter stated in the claims.

The "range" disclosed in the present disclosure is defined by a lower limit and a upper limit, and a given range is defined by selecting a lower limit and an upper limit, and the selected lower and upper limits define the boundaries of a particular range. The range defined in such a manner may or may not include an end value, and may be arbitrarily combined. That is, any lower limit may be combined with any upper limit to form a range. For example, if ranges 60-120 and 80-110 are specified for a particular parameter, it is also expected to understand that the ranges 60-110 and 80-120 are also expected. In addition, if minimum range values of 1 and 2 are listed, and if maximum range values of 3, 4 and 5 are listed, the following ranges 1-3, 1-4, 1-5, 2-3, 2-4, and 2-6 may all be expected. In the present disclosure, unless otherwise specified, the range of values "a-b" represents an abbreviated representation of any combination of real numbers from a to b, where a and b are both real numbers. For example, the range of values "0-5" represents that all real numbers between 0 and 5 have been listed herein, and "0-5" is only an abbreviated representation of combinations of these values. In addition, when an integer of ≥2 is described for a parameter, it is equivalent to disclosing this parameter is, for example, an integer of 2, 3, 4, 5, 6, 7, 8, 9, 10, 11 or 12, etc.

Unless otherwise specified, all embodiments of the present disclosure and optional embodiments may be combined with each other to form a new technical solution.

Unless otherwise specified, all technical features of the present disclosure and optional technical features may be combined with each other to form a new technical solution.

Unless otherwise specified, all steps in the present disclosure may be performed sequentially or randomly, preferably sequentially. For example, the method includes steps (a) and (b), indicating that the method may include steps (a) and (b) performed sequentially, and may also include steps (b) and (a) performed sequentially. For example, the mentioned method may also include a step (c), indicating that the step (c) may be added to the method in any order. For example, the method may include steps (a), (b) and (c), may also include steps (a), (c) and (b), may also include steps (c), (a) and (b), and the like.

Unless otherwise specified, "including" and "comprising" mentioned in the present disclosure indicate an open-ended form or a closed-ended form. For example, the "including" and "comprising" may mean that other components not listed may also be included or comprised, or only the listed components may be included or comprised.

Unless otherwise specified, the term "or" is inclusive in the present disclosure. For example, the phrase "A or B" means "A, B, or both A and B". More specifically, any of the following conditions satisfy a condition "A or B": A is true (or present) and B is false (or absent); A is false (or absent) and B is true (or present); or both A and B are true (or present).

In the perovskite solar cell, the hole transport layer material is an important component of efficient perovskite solar cells because of its functions of optimizing an interface, regulating energy level matching, etc. Therefore, the ideal hole transport layer material should meet the following properties: high hole mobility, with the highest occupied molecular orbital (HOMO) energy level of −5.1 eV to −5.3 eV; and high thermodynamic stability, good solubility and film-forming property, as well as hydrophobicity, so as to better protect the perovskite layer and improve the stability of the cell.

At present, the commonly used hole transport layer material is 2,2',7,7'-tetrakis[N,N-bis(4-methoxyphenyl)amino]-9,9'-spiro-OMeTAD, the structure of which is shown in Formula (A) below. However, the hole transport layer material has low hole mobility and therefore it needs to be applied to the hole transport layer together with additives including bis(trifluoromethane) sulfonimide lithium salt (Li-TFSI) and 4-tert-butylpyridine (TBP), to improve the hole mobility. However, these additives can cause degradation of the perovskite layer material, which is not conducive to the long-term operational stability of a device.

(A)

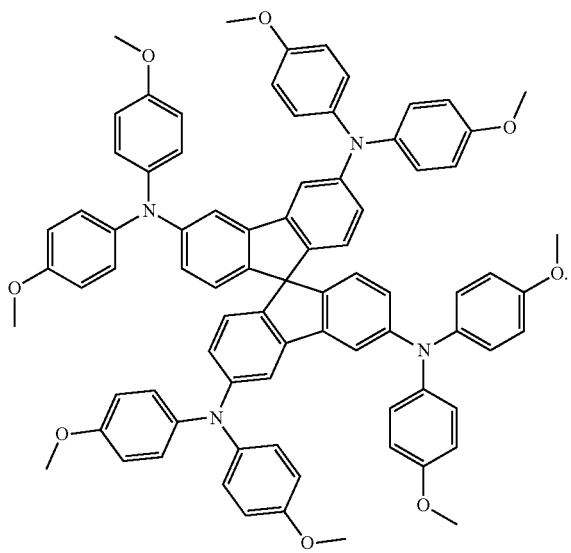

By analyzing the relationship of structure and properties of molecules of the hole transport layer material, the inventors have found that the connection mode of triphenylamine groups in the molecular structure has an important impact on their properties. By changing the connection mode and relative position between triphenylamine groups in the molecule, a new compound is obtained in the present disclosure, which has a deeper HOMO energy level and higher hole mobility, thereby avoiding the use of additives in the preparation of the hole transport layer, and improving the stability and photoelectric conversion efficiency of the device.

A first aspect of the present disclosure provides a compound having a structure of formula (I), where R1 is trivalent phenyl, optionally 1,3,4-benzenetriyl;

R2 is a single bond, $C_2$-$C_6$ conjugated alkenylene or an unsaturated 5-membered or 6-membered ring group containing heteroatoms selected from O, S, or Se; and optionally, R2 is single bond, vinylidene, furylidene, thiophenylene or selenophenylene.

In the present disclosure, the term "trivalent phenyl" as used refers to a trivalent group of benzene generated by the loss of any three hydrogen atoms of a benzene ring. The any three hydrogen atoms may be hydrogen atoms on three carbon atoms at any position of the benzene ring. Examples of trivalent phenyl are 1,3,4-benzenetriyl of formula (a), 1,2,4-benzenetriyl of formula (b), and 1,2,3-benzenetriyl of formula (c).

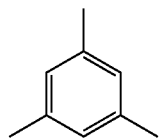
(a)

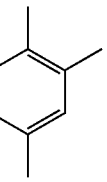
(b)

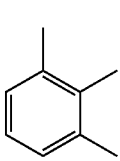
(c)

Optionally, R1 is 1,3,4-benzenetriyl of formula (a).

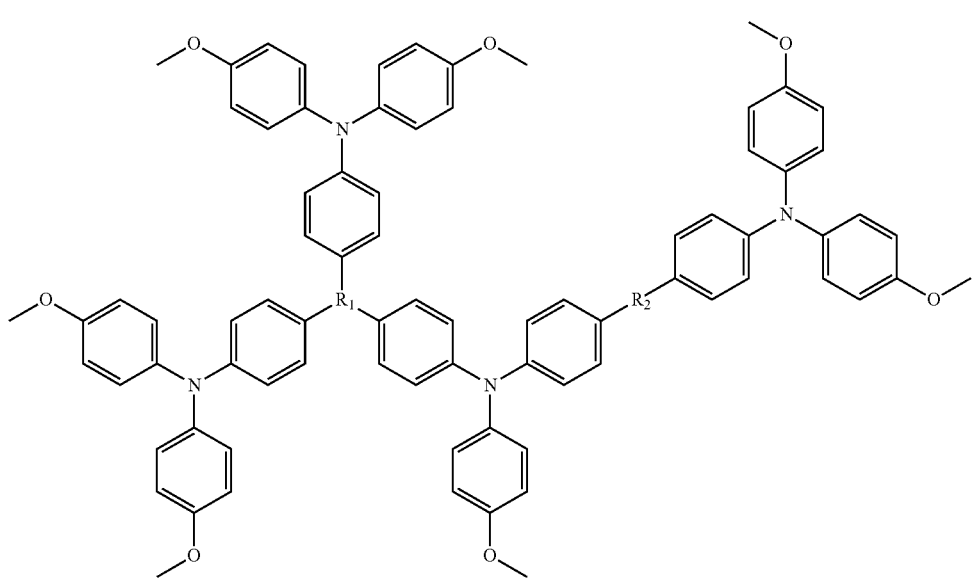
(I)

In the present disclosure, the term "$C_2$-$C_6$ conjugated alkenylene" as used refers to olefin having a structure in which single bonds and double bonds are alternate, for example —CH=CH—CH=CH—. Examples include, but are not limited to, vinylene, butadienyl, and hexatrienyl —CH=CH—CH=CH—CH=CH—.

In the present disclosure, the terms "furylidene, thiophenylene or selenophenylene" refer to divalent groups which are generated by the loss of any two hydrogen atoms from the corresponding compounds (furan, thiophene, and selenium). Any two hydrogen atoms may be two hydrogen atoms on any carbon atom in the corresponding compound. Examples include, but are not limited to, 2,5-furylidene, 2,5-thiophenylene, and 2,5-selenophenylene, which has the respective following structural formula:

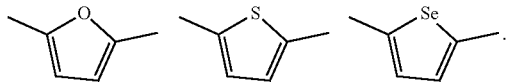

In the compound of formula (I) of the present disclosure, four triphenylamine groups are linked together by two linking groups R1 and R2, forming a new structural arrangement between the triphenylamine groups. R1 connects with three triphenylamine groups, and R2 connects two triphenylamine groups. This connection mode not only can play the role of regulating the molecular energy level, so that the HOMO energy level matches the HOMO energy level of the perovskite layer, but also can improve the hole mobility of the hole transport layer, thereby avoiding the use of additives, so as to further improve the photoelectric conversion efficiency and stability of light-emitting devices, in particular perovskite solar cells.

In some embodiments, the compound of the present disclosure is a compound of formula (I-1), formula (I-2) or formula (I-3),

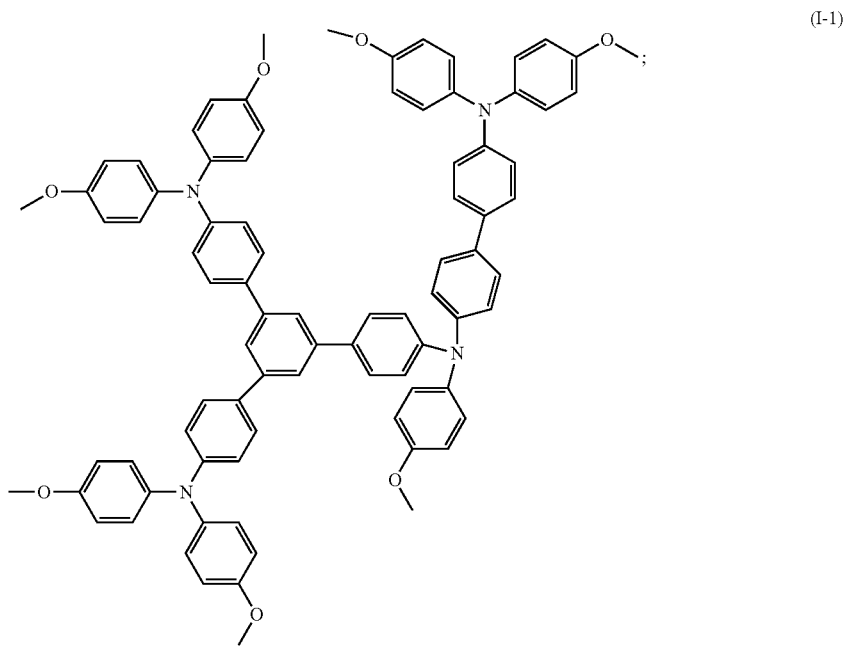

(I-1)

-continued

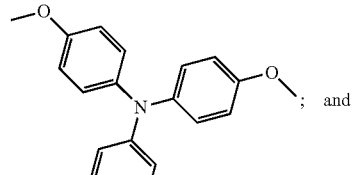
(I-2)

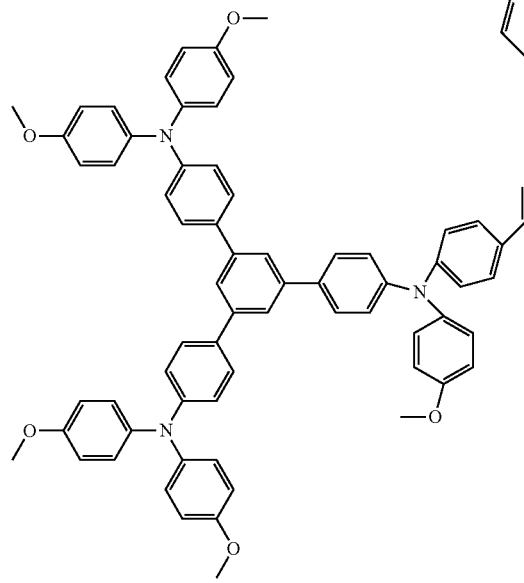

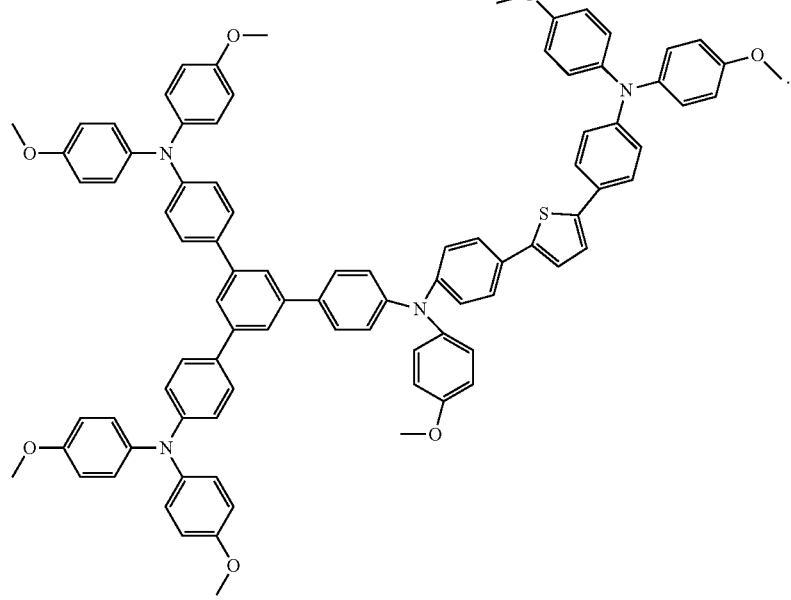
(I-3)

These compounds have high hole mobility, and HOMO energy level matching the valence band top energy level of the perovskite layer, as well as hydrophobicity, so as to better protect the perovskite layer, and improve the stability and photoelectric conversion efficiency of the light-emitting devices.

In some embodiments, the compound of formula (I) of the present disclosure has a HOMO energy level of −5.05 eV to −5.30 eV, optionally −5.1 eV to −5.2 eV, and a charge mobility of $1.0 \times 10^{-4}$ $cm^2V^{-1}s^{-1}$ to $8.0 \times 10^{-4}$ $cm^2V^{-1}s^{-1}$, optionally $2.0 \times 10^{-4}$ $cm^2V^{-1}s^{-1}$ to $6.0 \times 10^{-4}$ $cm^2V^{-1}s^{-1}$.

Therefore, the compound may be applied to light-emitting devices, in particular perovskite solar cells, as a hole transport material, thereby improving the photoelectric conversion efficiency and stability of the device.

In the present disclosure, the HOMO energy level of the compound of formula (I) is determined using ultraviolet photoelectron spectroscopy UPS (AXIS ULTRA DLD from Kratos Company), e.g., using a HOMO energy level determination method described in the examples.

In the present disclosure, the compound of formula (I-1) has a HOMO energy level of −5.2 eV, the compound of formula (I-2) has a HOMO energy level of −5.1 eV, and the compound of formula (I-3) has a HOMO energy level of −5.2 eV.

In the present disclosure, the hole mobility of the compound of formula (I) is determined by a space charge limiting current (SCLC) method, e.g., using a hole mobility determination method described in the examples.

In the present disclosure, the compound of formula (I-1) has a hole mobility of $3.5 \times 10^{-4}$ $cm^2V^{-1}s^{-1}$, the compound of formula (I-2) has a hole mobility of $5.0 \times 10^{-4}$ $cm^2V^{-1}s$ 1, and the compound of formula (I-3) has a hole mobility of $2.0 \times 10^{-4}$ $cm^2V^{-1}s^{-1}$.

A second aspect of the present disclosure provides a preparation method of the compound of formula (I). The method includes the following steps:

Step 1: preparation of a compound of formula (II):

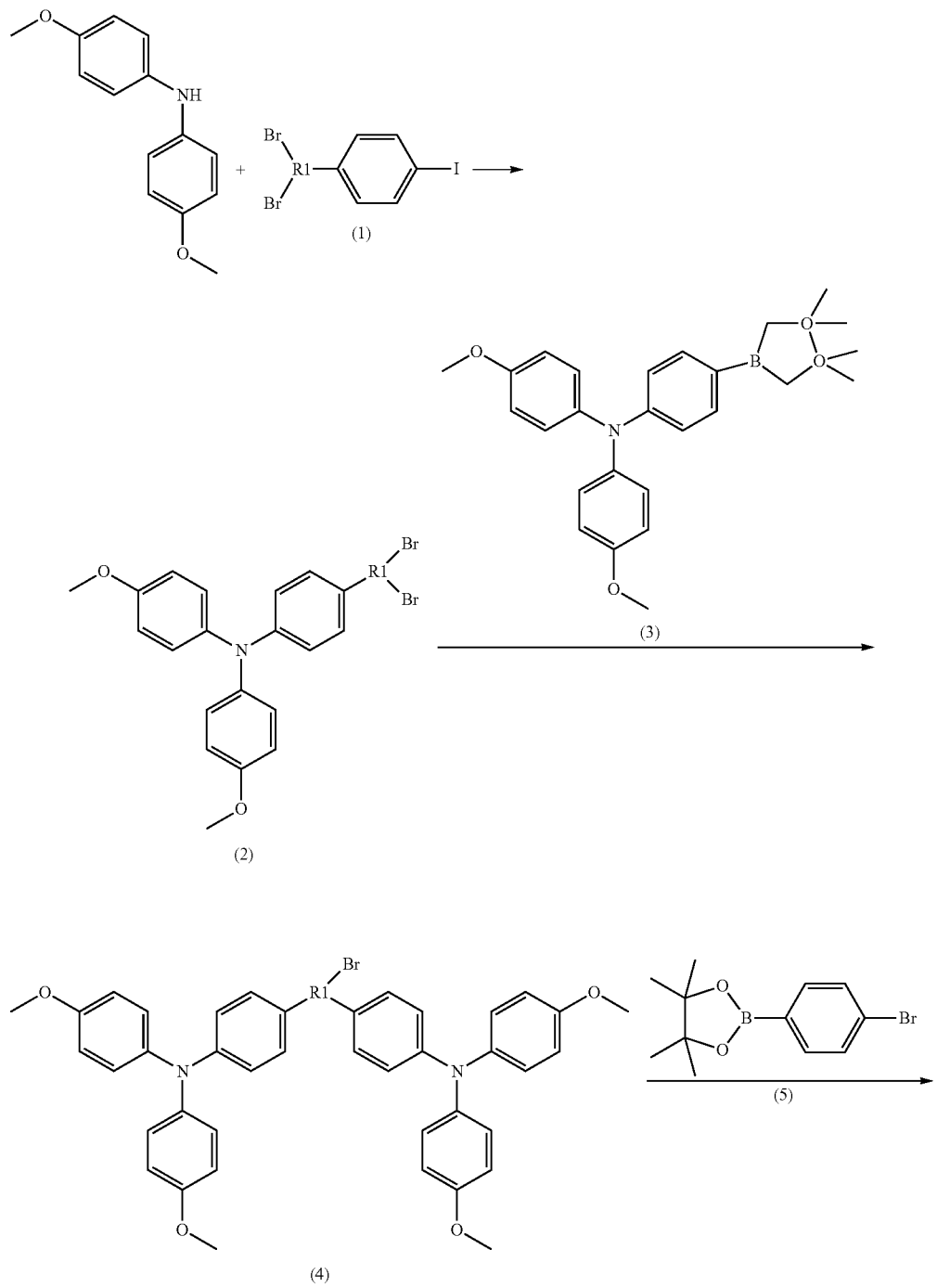

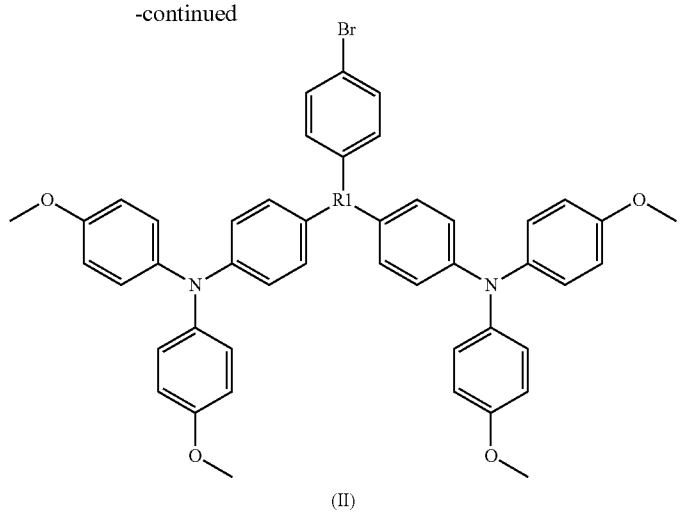

(II)

4,4'-dimethoxydiphenylamine and an iodobenzene dibromide of formula (1) undergo a coupling reaction to form an intermediate (2), the intermediate (2) and 4-borate-4',4'-dimethoxytriphenylamine of formula (3) undergo a coupling reaction to generate an intermediate (4), and the intermediate (4) and 2-(4-bromophenyl)-4,4,5,5-tetramethyl-1,3,2-dioxaborolane of formula (5) undergo a coupling reaction to obtain the compound of formula (II);

Step 2: preparation of a compound of formula (III):

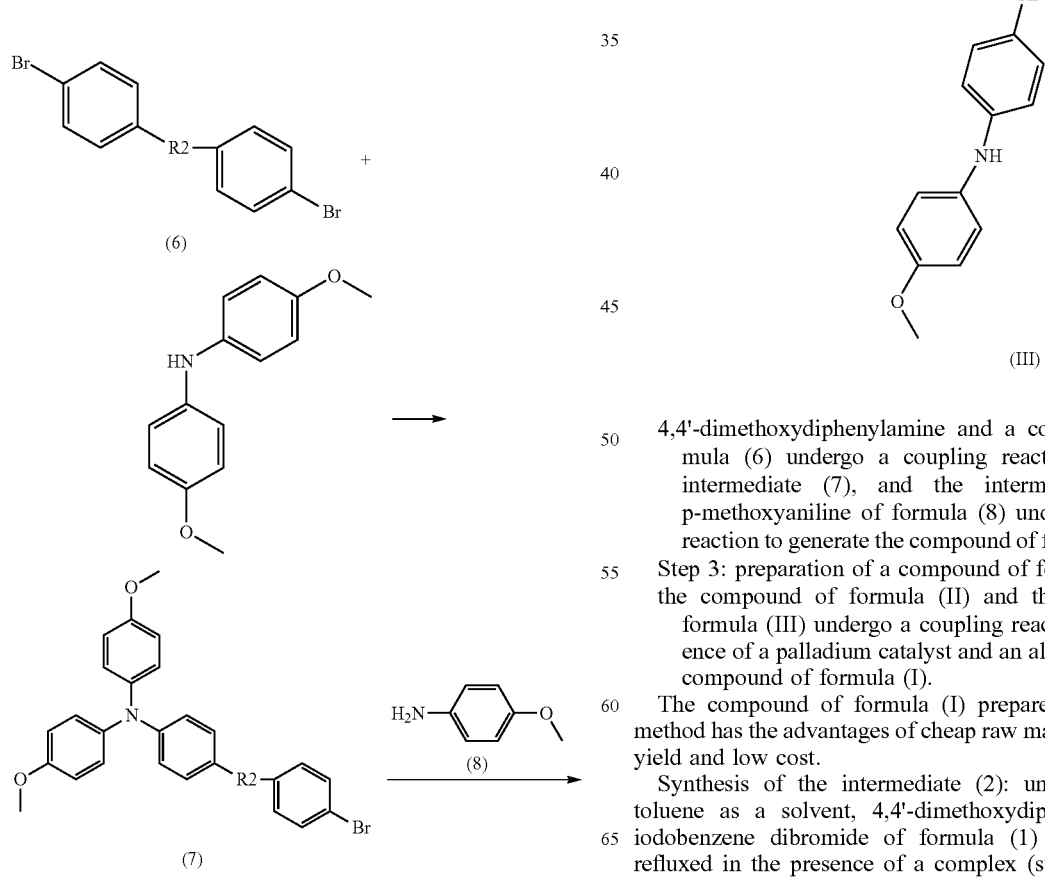

(III)

4,4'-dimethoxydiphenylamine and a compound of formula (6) undergo a coupling reaction to form an intermediate (7), and the intermediate (7) and p-methoxyaniline of formula (8) undergo a coupling reaction to generate the compound of formula (III); and Step 3: preparation of a compound of formula (I):

the compound of formula (II) and the compound of formula (III) undergo a coupling reaction in the presence of a palladium catalyst and an alkali to obtain the compound of formula (I).

The compound of formula (I) prepared by the above method has the advantages of cheap raw material price, high yield and low cost.

Synthesis of the intermediate (2): under argon, with toluene as a solvent, 4,4'-dimethoxydiphenylamine and iodobenzene dibromide of formula (1) are heated and refluxed in the presence of a complex (such as PdCl(η3-C$_3$H$_5$)]$_2$) and a strong base (cesium carbonate) to generate the intermediate (2). A molar ratio of the 4,4'-dimethoxydiphenylamine to the compound of formula (1) to the complex to the strong base is 1:(1-1.2):(0.01-0.015):(0.02-0.025):(1.5-1.8).

Synthesis of the intermediate (4): under argon, with tetrahydrofuran and water as solvents, the intermediate (2) and 4-borate-4',4'-dimethoxytriphenylamine of formula (3) are heated and refluxed in the presence of a catalyst (such as Pd(PPh$_3$)$_4$) and a strong base (such as sodium hydroxide) to generate the intermediate (4). A molar ratio of the intermediate (2) to the borate compound of formula (3) to the catalyst to the strong base 1:(1.08-1.2):(0.025-0.035):(2.95-3.05).

Synthesis of the compound of formula (II):under argon, at 40 –60° C., with ethanol and water as solvents, the intermediate (4) and 2-(4-bromophenyl)-4,4,5,5-tetramethyl-1,3,2-dioxaborolane are reacted in the presence of a strong base (e.g., potassium carbonate) and a catalyst (e.g., tris(dibenzylideneacetone) dipalladium Pd$_2$(dba)$_3$) to generate the compound of formula (II). A molar ratio of the intermediate (4) to the borate compound of formula (5) to the strong base to the catalyst is 1:(1.0-1.25):(1.8-2.2):(0.01-0.5).

Synthesis of the intermediate (7): under argon, at 105-120° C., with toluene as a solvent, 4,4'-dimethoxydiphenylamine and the compound of formula (6) are reacted in the presence of catalyst (e.g., Pd$_2$(dba)$_3$), a strong base (e.g., cesium carbonate) and a ligand (e.g., tri-tert-butylphosphine) to generate the intermediate (7). A molar ratio of the compound of formula (6) to the 4,4'-dimethoxydiphenylamine to the catalyst to the strong base is 1:(1-1.25):(0.015-0.03):(1.5-2.2).

Synthesis of the compound of formula (III): under argon, at 105-120° ° C., with toluene as a solvent, the intermediate (7) and p-methoxyaniline of formula (8) are reacted in the presence of a catalyst (e.g., Pd$_2$(dba)$_3$), a strong base (e.g., cesium carbonate) and a ligand (e.g., tri-tert-butylphosphine) to generate the compound of formula (III). A molar ratio of the intermediate (7) to the p-methoxyaniline of formula (8) to the catalyst to the strong base is 1:(1-1.25):(0.015-0.03):(1.5-2.2).

Synthesis of the compound of formula (I): under argon, at 105-120° C., with toluene as a solvent, the compound of formula (II) and the compound of formula (III) are reacted in the presence of a catalyst (e.g., Pd$_2$(dba)$_3$), a strong base (e.g., cesium carbonate) and a ligand (e.g., tri-tert-butylphosphine) to generate the compound of formula (I). A molar ratio of the compound of formula (II) to the compound of formula (III) to the catalyst to the strong base is 1:(1-1.2):(0.15-0.3):(18-22).

In the above reactions, the catalyst is a palladium catalyst, including but not limited to Pd(PPh$_3$)$_4$, Pd$_2$(dba)$_3$ or PdAc$_2$.

In the above reactions, the strong base includes, but is not limited to, sodium hydroxide, cesium carbonate or potassium carbonate.

In the above reactions, the solvent includes, but is not limited to, one or more of toluene, ethanol, tetrahydrofuran or water.

The compound of formula (6) may be commercially purchased or prepared in accordance with the methods provided by the examples.

A third aspect of the present disclosure provides uses of the compound of formula (I) described in the first aspect of the present disclosure and the compound of formula (I) obtained according to the preparation method described in the second aspect of the present disclosure, and use of the compound of formula (I) as a hole transport material in a light-emitting device. The light-emitting device includes an organic electroluminescent device, and a perovskite solar cell.

Based on the compound of formula (I) of the present disclosure has a deeper HOMO energy level and a higher hole mobility, and thus it can be applied to light-emitting devices to improve the photoelectric conversion efficiency and stability of the device.

The present disclosure provides a perovskite solar cell, which includes a conductive glass, an electron transport layer, a perovskite layer, a hole transport layer, and a metal electrode. The hole transport layer includes the compound of formula (I) provided in the first aspect of the present disclosure or the compound of formula (I) obtained according to the preparation method provided in the second aspect of the present disclosure. As a result, the perovskite solar cell with good photoelectric conversion efficiency and stability is obtained.

Perovskite Solar Cells

Perovskite solar cells may be divided into forward and inverted types according to the difference in an incident surface. The forward perovskite solar cell may sequentially include conductive glass, an electron transport layer, a perovskite layer, a hole transport layer, and a metal electrode in structure. That is, incident light sequentially passes through the conductive glass, the electron transport layer, the perovskite layer, the hole transport layer, and the metal electrode.

The inverted perovskite solar cell may sequentially include conductive glass, a hole transport layer, a perovskite layer, an electron transport layer, and a metal electrode. That is, incident light sequentially passes through the conductive glass, the hole transport layer, the perovskite layer, the electron transport layer, and the metal electrode.

FIG. 1 is a schematic structure diagram of a forward perovskite solar cell in an embodiment of the present disclosure. The forward perovskite solar cell sequentially includes conductive glass, an electron transport layer, a perovskite layer, a hole transport layer, and a metal electrode from top to bottom, and incident light enters from the upper conductive glass.

The following describes the structural components of the perovskite solar cell of the present disclosure, but the present disclosure is not limited thereto.

Conductive Glass

The conductive glass usually has a certain degree of transparency. Transparent conductive glass is generally used. The conductive glass usually consists of a glass substrate and an oxide film (TCO for short) conductive layer. Commonly used TCOs include, but are not limited to, the following materials: fluorine-doped tin oxide (FTO), indium tin oxide (ITO), aluminum-doped zinc oxide (AZO), boron-doped zinc oxide (BZO), and zinc indium oxide (IZO). The conductive glass is usually any conductive glass used in the art. The conductive glass is commercially available.

The conductive glass needs to be cleaned before use, i.e., ultrasonically cleaned with a cleaning agent, deionized water, ethanol, etc.

Electron Transport Layer

Materials of the electron transport layer may be materials commonly used in the art, including, but not limited to: methyl[6,6]-phenylC$_{61}$butyrate (PC61BM), methyl[6,6]-phenylC$_{71}$ butyrate (PC71BM), fullerene C60 (C60), fullerene C70 (C70), tin dioxide (SnO$_2$), zinc oxide (ZnO), or titanium dioxide (TiO$_2$), and derivatives of the above substances, materials obtained by doping or passivation, etc.

The electron transport layer may be prepared by conventional methods in the art, or by the following method: the electron transport layer material is dissolved in an organic solvent (e.g., chlorobenzene, dichlorobenzene, toluene, or xylene) to prepare a solution of the electron transport layer material with a concentration range of 5-50 mg/ml. Then, the solution is coated onto the surface of the conductive glass or perovskite layer by means of spin coating by a homogenizer at a rotating speed of 500-5000 rpm and a spin coating time of 5-50 seconds, and then annealed at an annealing temperature of 80-150° C. for 5-60 min, to obtain the electron transport layer.

The thickness of the electron transport layer may be any thickness used in the art. Optionally, the electron transport layer is 40 nm to 100 nm thick.

Perovskite Layer

A chemical formula of the perovskite layer satisfies $ABX_3$ or $A_2CDX_6$, where A is inorganic or organic or organic-inorganic mixed cation, which may be at least one of MA, FA, Cs; B is an inorganic or organic or organic-inorganic mixed cation, which may be at least one of Pb and Sn; C is an inorganic or organic or organic-inorganic mixed cation, commonly Ag; D is an inorganic or organic or organic-inorganic mixed cation, which may be at least one of bismuth cation $Bi^{3+}$, antimony cation $Sb^{3+}$, and indium cation $In^{3+}$; and X is an inorganic or organic or organic-inorganic mixed anion, which may be at least one of Br or I. The perovskite layer has a band gap of 1.20-2.30 eV.

The perovskite layer has a valence band top energy level (the valence band top energy level refers to the highest energy level that electrons in the material can occupy when the temperature is 0 K) of −5.30 eV to −5.60 eV, optionally −5.30 eV to −5.50 eV.

In the present disclosure, a chemical formula of perovskite is $(Cs_{0.05}FA_{0.93}MA_{0.02})Pb(I_{0.98}Br_{0.02})_3$, and the perovskite has a valence band top energy level of −5.40 e V.

The perovskite layer may be prepared by conventional technical means in the art, or by the following method (taking a perovskite solar cell with a forward structure as an example): perovskite precursor materials, such as plumbum iodide ($PbI_2$), formamidine iodide (FAI), cesium iodide (CsI), methylammonium bromide (MABr), or plumbum bromide ($PbBr_2$), are weighed and dissolved in a solvent (e.g., dimethylformamide (DMF), or dimethyl sulfoxide (DMSO)), stirred well, and filtered to obtain a supernatant; the supernatant covers the prepared electron transport layer or hole transport layer by means of spin coating by a homogenizer at a rotating speed of 500-5000 rpm and a spin coating time of 5-50 seconds; after coating, annealing is carried out at an annealing temperature of 80-150° C. for 0-60 min; and the perovskite layer is obtained after annealing.

The thickness of the perovskite layer may be any thickness used in the art. Optionally, the perovskite layer has a thickness of 200 nm to 1000 nm.

Hole Transport Layer

The hole transport layer includes a compound of formula (I) described in the first aspect of the present disclosure or a compound of formula (I) prepared according to the method described in the second aspect of the present disclosure:

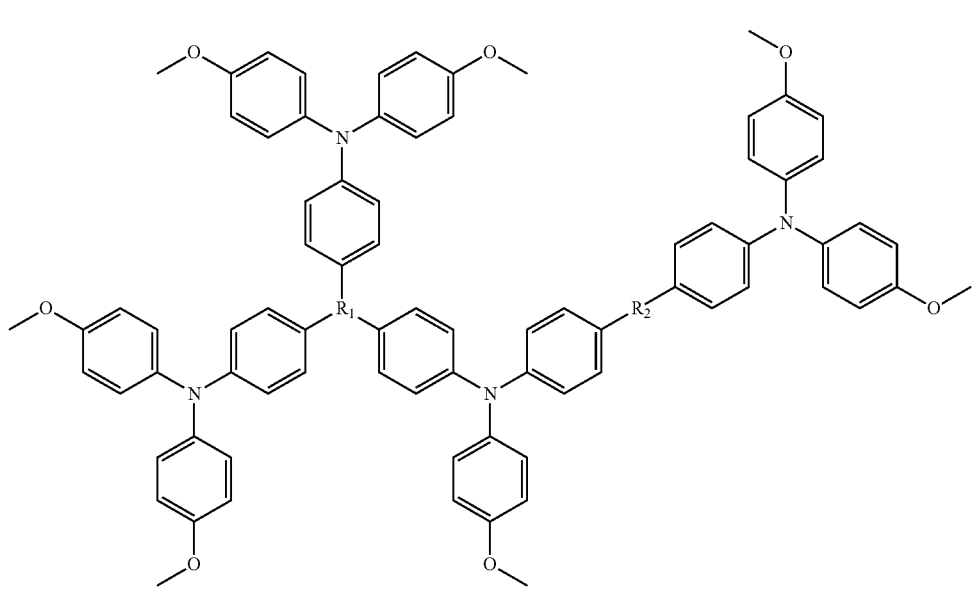

(I)

where R1 is trivalent phenyl, optionally 1,3,4-benzenetriyl;

R2 is a single bond, $C_2$-$C_6$ conjugated alkenylene or an unsaturated 5-membered or 6-membered ring group containing heteroatoms selected from O, S, or Se; and optionally, R2 is single bond, vinylidene, furylidene, thiophenylene or selenophenylene.

In some embodiments, the hole transport layer of the present disclosure contain no additives, the additives being selected from lithium salts, cobalt salts, or co-solvents, including one or more of bis(trifluoromethane)sulfonimide lithium salt (Li-TFSI), cobalt-base(III)bis-trifluoromethane sulfonimide salt (FK209, Co(III) TFSI), and 4-tert-butylpyridine (tBP).

At present, the most commonly used hole transport material is Spiro-OMeTAD (shown in Formula (A) above). When it is applied to the hole transport layer, additives such as lithium salts and tBP are often required to increase the hole mobility. However, lithium salt will penetrate into the perovskite layer, eventually leading to the degradation of the perovskite layer material, which is not conducive to the long-term operation stability of perovskite solar cell devices.

Through a large number of researches and practice, the inventors have designed the compound of formula (I) of the present disclosure, which has a higher hole mobility and has a HOMO energy level that perfect matches the perovskite layer, so that the use of additives can be avoided to further improve the photoelectric conversion efficiency and stability of perovskite cells.

In the present disclosure, the hole transport layer may also be composed of a compound of formula (I) described in the present disclosure or a compound of formula (I) prepared according to the method described in the present disclosure, excluding any other hole transport material that can be used for perovskite solar cells.

Optionally, the compound of formula (I) is a compound of formula (I-1), formula (I-2), or formula (I-3):

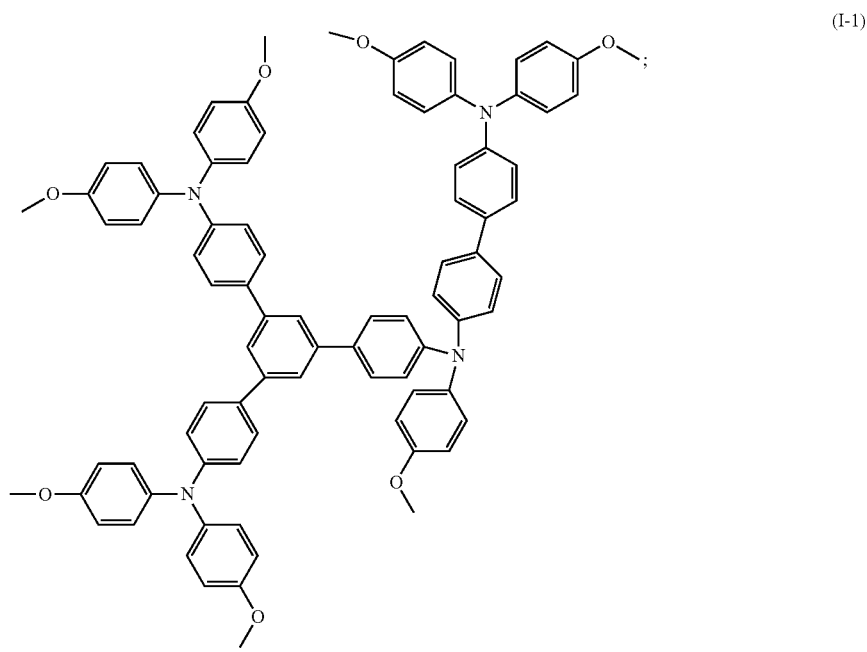

(I-1)

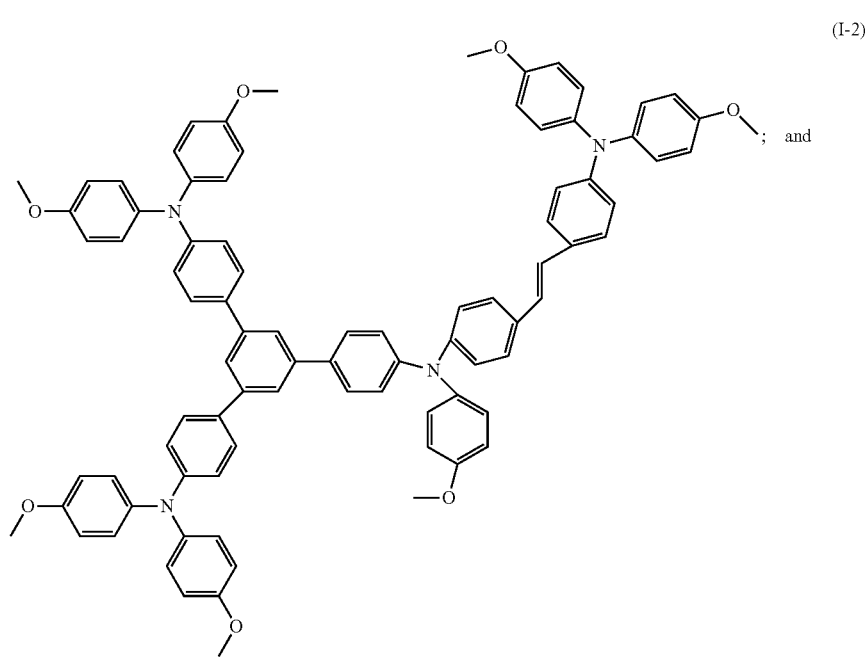

(I-2)

and

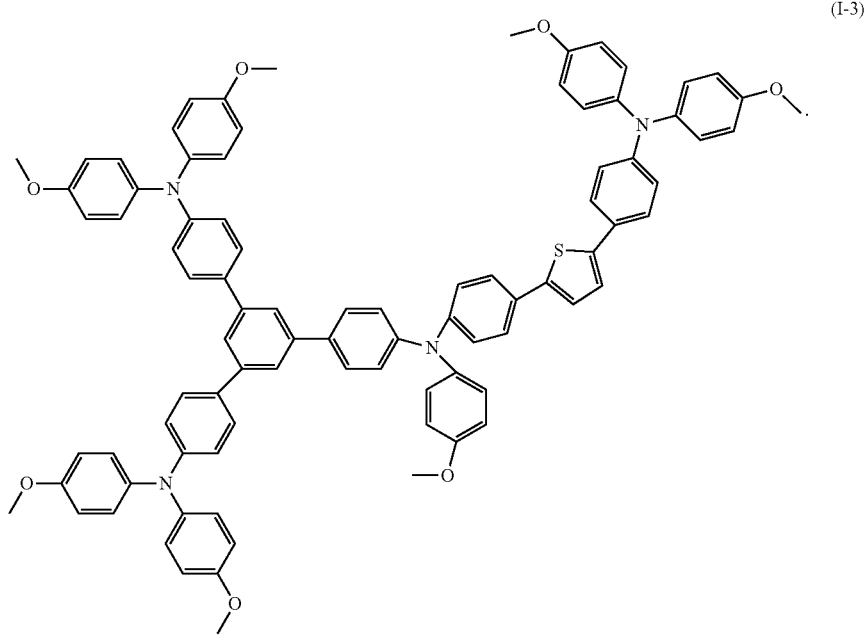

(I-3)

In some embodiments, in the perovskite solar cell of the present disclosure, a HOMO energy level of the hole transport layer is −5.05 eV to −5.30 eV, optionally −5.1 eV to −5.2 eV; and a valence band top energy level of the perovskite layer is −5.30 eV to −5.60 eV, optionally −5.30 eV to −5.50 eV.

Optionally, the HOMO energy level of the hole transport layer is greater than the valence band top energy level of the perovskite layer, with an energy level difference of 0.3 eV to 0.05 eV, optionally 0.3 eV to 0.2 eV.

In the perovskite solar cell of the present disclosure, the hole transport material of the hole transport layer is a compound of formula (I) of the present disclosure, and this compound has a HOMO energy level of −5.05 eV to −5.30 eV, optionally −5.1 eV to −5.2 eV, and a charge mobility of $1.0 \times 10^{-4}$ $cm^2V^{-1}s^{-1}$ to $8.0 \times 10^{-4}$ $cm^2V^{-1}s^{-1}$, optionally $2.0 \times 10^{-4}$ $cm^2V^{-1}s^{-1}$ to $6.0 \times 10^{-4}$ $cm^2V^{-1}s^{-1}$.

In an embodiment, the hole transport layer includes a compound of formula (I-1) of the present disclosure or consists of a compound of formula (I-1) of the present disclosure. The hole transport layer has a HOMO energy level of −5.2 eV and a hole mobility of $3.5 \times 10^{-4}$ $cm^2V^{-1}s^{-1}$. In an embodiment, the hole transport layer includes a compound of formula (I-2) of the present disclosure or consists of a compound of formula (I-2) of the present disclosure. The hole transport layer has a HOMO energy level of −5.1 eV and a hole mobility of $5.0 \times 10^{-4}$ $cm^2V^{-1}s^{-1}$. In an embodiment, the hole transport layer includes a compound of formula (I-3) of the present disclosure or consists of a compound of formula (I-3) of the present disclosure. The hole transport layer has a HOMO energy level of −5.2 eV and a hole mobility of $2.0 \times 10^{-4}$ $cm^2V^{-1}s^{-1}$.

The compound of formula (I) of the present disclosure has strong hydrophobicity. When the hole transport layer is within the above thickness range, the hole transport layer can not only play the role of extracting and transporting holes, but also help to block the invasion of external water and oxygen, thereby helping to improve the long-term operation stability of perovskite solar cells.

In some embodiments, in the perovskite solar cell of the present disclosure, the hole transport layer has a thickness of 5 nm to 100 nm, optionally 30 nm to 80 nm.

A strongest absorption peak of the compound of formula (I) of the present disclosure is less than 400 nm, which indicates that the compound of formula (I) and the hole transport layer including the same will not absorb visible light.

The hole transport layer may be prepared by conventional methods in the art, including but not limited to, a sol method, a blade coating method and a slit coating method.

In some embodiments, in the perovskite solar cell of the present disclosure, the hole transport layer is prepared by the following method:

the compound of formula (I) described in the first aspect of the present disclosure and the compound of formula (I) obtained according to the preparation method described in the second aspect of the present disclosure are dissolved in an organic solvent to prepare a solution of the hole transport material; and then, the solution of the hole transport material is coated onto the surface of the perovskite layer or conductive glass, and the solvent is removed to obtain the hole transport layer, when the perovskite solar cell is a forward perovskite solar cell, the concentration of the compound of formula (I) in the solution of the hole transport material is 20-100 mg/mL; when the perovskite solar cell is an inverted perovskite solar cell, the concentration of the compound of formula (I) in the solution of the hole transport material is 1-50 mg/ml; and the organic solvent is toluene, chlorobenzene or dichloromethane.

Optionally, the coating may be spin-coating performed using a homogenizer. The rotating speed is 500-5000 rpm and the spin-coating time is 5-50 seconds. After spin coating, the solvent may be removed by annealing. For example, when annealing is used, the annealing temperature is 80-400° C., the annealing time is 0-120 min, and the hole transport layer is obtained after annealing.

Metal Electrode

The metal electrode may be any electrode used in the art. Optionally, the metal electrode is an organic or inorganic or organic-inorganic mixed conductive material, including but not limited to the following materials: Ag, Cu, C, Au, Al. The metal electrode may be prepared by evaporation.

The thickness of the metal electrode may be any thickness used in the art. Optionally, the thickness of the metal electrode is 10-200 nm.

[Preparation Method of Perovskite Solar Cell]

In some embodiments, the perovskite solar cell described in the present disclosure is a forward perovskite solar cell.

The preparation method of the forward perovskite solar cell includes the following steps:
  Step 1: preparing a hole transport material of formula (I) of the present disclosure;
  Step: 2: etching and cleaning a transparent conductive glass substrate, and blowing to dryness for later use;
  Step 3: preparing an electron transport layer on conductive glass;
  Step 4: preparing a perovskite layer on the electron transport layer;
  Step 5: preparing a solution of the hole transport material of formula (I) of the present disclosure for later use;
  Step 6: preparing a hole transport layer on the perovskite layer; and
  Step 7: preparing a metal electrode layer on the hole transport layer, and performing an edge cleaning test.

The preparation method of the inverted perovskite solar cell includes the following steps:
  Step 1: preparing a hole transport material of formula (I) of the present disclosure;
  Step: 2: etching and cleaning a transparent conductive glass substrate, and blowing to dryness for later use;
  Step 3: preparing a solution of the hole transport material of formula (I) of the present disclosure for later use;
  Step 4: preparing a hole transport layer on conductive glass;
  Step 5: preparing a perovskite layer on the hole transport layer;
  Step 6: preparing an electron transport layer on the perovskite layer; and
  Step 7: preparing a metal electrode layer on the electron transport layer, and performing an edge cleaning test.

The specific operations of the above respective steps are described above or prepared according to the examples.

It should be understood that although the present disclosure provides the perovskite solar cell including the compound of formula (I) in some embodiments, the present disclosure is not limited thereto. All light-emitting devices including the compound of formula (I) of the present disclosure (e.g., including but not limited to a perovskite solar cell or OLED device) and the preparation methods of the light-emitting devices all fall within the scope of disclosure of the present disclosure.

EXAMPLES

The following describes the examples of the present disclosure. The examples described below are exemplary, and are only intended to explain the present disclosure, rather than being construed as limitations to the present disclosure. If specific techniques or conditions are not indicated in the examples, it shall be carried out in accordance with the techniques or conditions described in the literature in the art or in accordance with the product specification. The reagents or instruments used, which are not marked with manufactures, are conventional products that are commercially available.

I. Preparation Example

Example 1: Preparation of (5'-(4-(bis(4-ethylphenyl)amino)phenyl)-N4-(4'-(bis(4-methoxyphenyl)amino)-[1,1'-biphenyl]-4-yl)-N4,N4',N4'-tris(4-methoxyphenyl)-[1,1':3',1'-triphenyl]-4,4'-diamine) (compound of formula (I-1))

Step S1: Synthesis of 3',5'-dibromo-N,N-bis(4-methoxyphenyl)-[1,1'-biphenyl]-4-amine

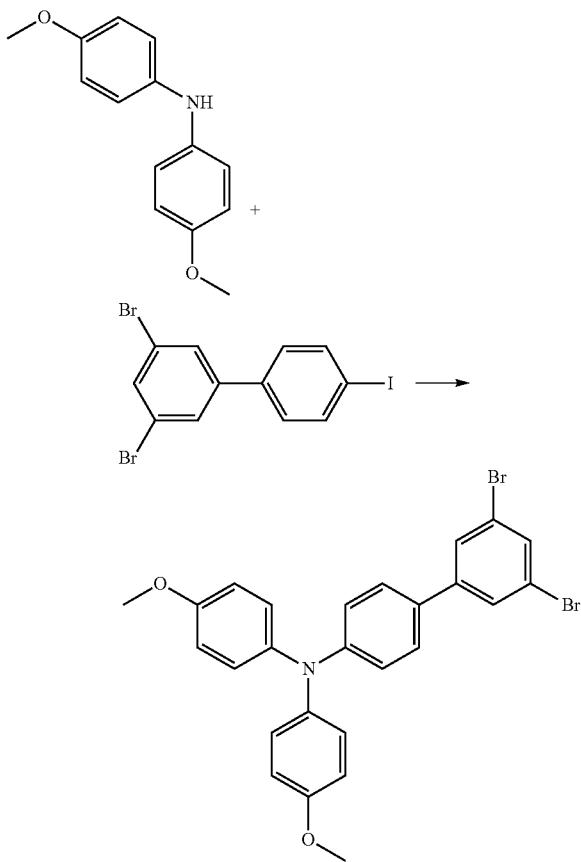

4,4'-dimethoxydiphenylamine (40 mmol, 9.17 g), 3,5-dibromo-4'-iodo-1,1'-biphenyl (40 mmol, 17.52 g), complex allylpalladium(II) chloride dimer PdCl(η3-C$_3$H$_5$)]$_2$ (0.4 mmol, purchased from Bide Pharmatech, CAS: 12012-95-2), cesium carbonate (0.8 mmol), and succinic acid (60 mmol) were added to a Schlenk tube. Then, the Schlenk tube was vacuumed and introduced with argon, and the operation was repeated 3 times to keep the Schlenk tube filled with argon. Under argon, 180 ml of toluene was added to the mixture in the Schlenk tube. The Schlenk tube was placed in an oil bath at 115° C., and the reaction mixture was stirred for 20 h under reflux. After the reaction was completed, the mixture was extracted with saturated saline (50 ml each time, 3 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:4, in a volume ratio) to obtain 12.25 g of product 3',5'-dibromo-N,N-bis(4-methoxyphenyl)-[1,1'-biphenyl]-4-amine with a yield of 56.8%.

¹HNMR (CDCl₃, 400 MHz): δ 3.75 (6H, s), 6.71 (4H, ddd, J=8.7, 2.7, 0.5 Hz), 7.02-7.23 (5H, 7.09 (ddd, J=8.7, 1.3, 0.5 Hz), 7.17 (t, J=1.8 Hz)), 7.26-7.56 (6H, 7.33 (ddd, J=8.9, 1.5, 0.5 Hz), 7.45 (ddd, J=8.9, 1.5, 0.5 Hz), 7.51 (t, J=1.8 Hz)).

Step S2: Synthesis of 5'-bromo-N4,N4',N4',N4'-tetrakis(4-methoxyphenyl)-[1,1':3',1'-triphenyl]-4,4'-diamine mixture was stirred for 24 h at 110° C., extracted with dichloromethane (50 ml each time, 4 times). An organic layer was dried by anhydrous MgSO₄, filtered, and evaporated to dryness under reduced pressure to obtain a crude product. The crude product was separated by column chromatography (a stationary phase was 200-300 mesh silica gel, and a mobile phase was dichloromethane:n-hexane=1:5, in a volume ratio) to obtain 12.03 g of product 5'-bromo-N4, N4,N4',N4'-tetrakis(4-methoxyphenyl)-[1,1':3', 1'-triphenyl]-4,4'-diamine with a yield of 69.7%.

¹HNMR (CDCl₃, 400 MHz): δ 3.75 (12H, s), 6.71 (8H, ddd, J=8.7, 2.7, 0.5 Hz), 7.09 (8H, ddd, J=8.7, 1.3, 0.5 Hz), 7.27-7.48 (10H, 7.33 (ddd, J=8.9, 1.5, 0.5 Hz), 7.38 (ddd, J=8.9, 1.5, 0.5 Hz), 7.42 (t, J=1.8 Hz)), 8.05 (1H, t, J=1.8 Hz).

Step S3: Synthesis of 5'-(4-bromophenyl)-N4,N4, N4', N4'-tetrakis(4-methoxyphenyl)-[1,1':3',1'-triphenyl]-4,4'-diamine

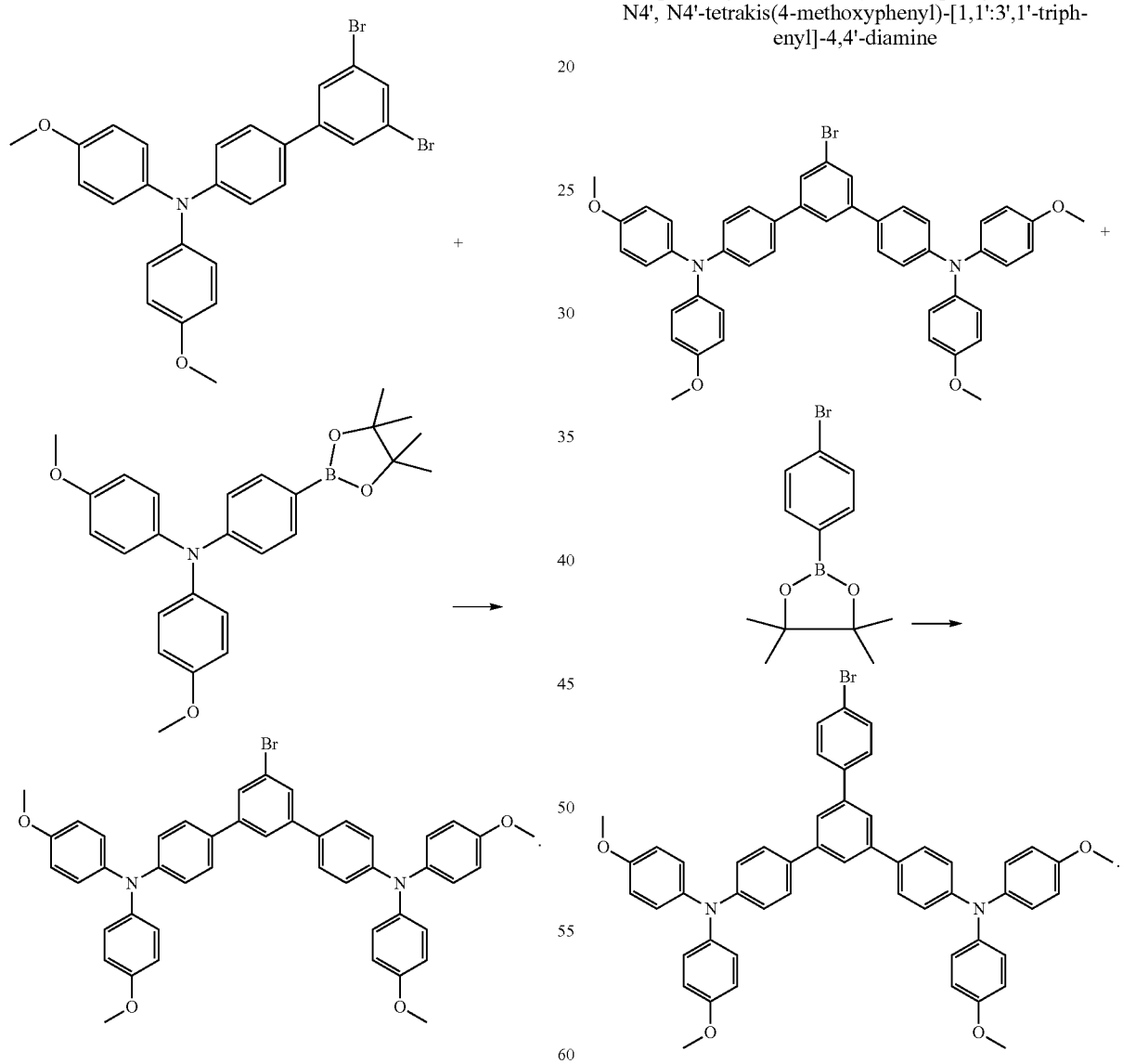

A solution of tetrahydrofuran THF (80 ml) of 3',5'-dibromo-N,N-bis(4-ethylphenyl)-[1,1'-biphenyl]-4-amine (12.19 g, 22.6 mmol) prepared in Step S1, 4-borate-4',4'-dimethoxytriphenylamine (10.70 g, 24.8 mmol, purchased from Bide Pharmatech, CAS: 875667-84-8), Pd(PPh₃)₄ (0.78 g, 0.7 mmol), NaOH (2.71 g, 67.7 mmol), and water (40 ml) were added to a round-bottom flask. The reaction The 5'-bromo-N4,N4,N4', N4'-tetrakis(4-methoxyphenyl)-[1,1':3', 1'-triphenyl]-4,4'-diamine (8.39 g, 10 mmol) prepared in Step S2, 2-(4-bromophenyl)-4,4,5,5-tetramethyl-1,3,2-dioxaborolane (3.4 g, 12 mmol), purchased from Bide Pharmatech, CAS: 68716-49-4), potassium carbonate (20 mmol) and tris(dibenzylideneacetone)dipalladium(0)

Pd$_2$(dba)$_3$ (purchased from Bide Pharmatech, CAS: 60748-47-2) (0.2 mmol), tri-tert-butylphosphine (0.8 mmol), and a mixture (30 ml) of EtOH and H$_2$O in a volume ratio of 1:1 were added to a Schlenk tube. Then, the Schlenk tube was vacuumed and introduced with argon, and the operation was repeated 3 times to keep the Schlenk tube filled with argon. Under argon, the reaction mixture was stirred for 2.5 h at 50° C. After the reaction was completed, the mixture was cooled to room temperature and extracted with CH$_2$Cl$_2$ (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was dichloromethane:n-hexane=1:4, in a volume ratio) to obtain 5.18 g of product 5'-(4-bromophenyl)-N4,N4,N4',N4'-tetrakis(4-methoxyphenyl)-[1,1':3',1'-triphenyl]-4,4'-diamine with a yield of 61.8%.

$^1$HNMR (CDCl$_3$, 400 MHz): δ 3.75 (12H, s), 6.71 (8H, ddd, J=8.7, 2.7, 0.5 Hz), 7.08 (8H, ddd, J=8.7, 1.3, 0.5 Hz), 7.28-7.56 (12H, 7.34 (ddd, J=8.9, 1.5, 0.5 Hz), 7.36 (ddd, J=8.9, 1.6, 0.5 Hz), 7.44 (ddd, J=8.7, 1.5, 0.5 Hz), 7.50 (ddd, J=8.7, 1.6, 0.5 Hz)), 7.97-8.08 (3H, 8.03 (t, J=1.9 Hz), 8.03 (t, J=1.9 Hz)).

Step S4: Synthesis of N4,N4-bis(4-methoxyphenyl)-[1,1'-biphenyl]-4-amine

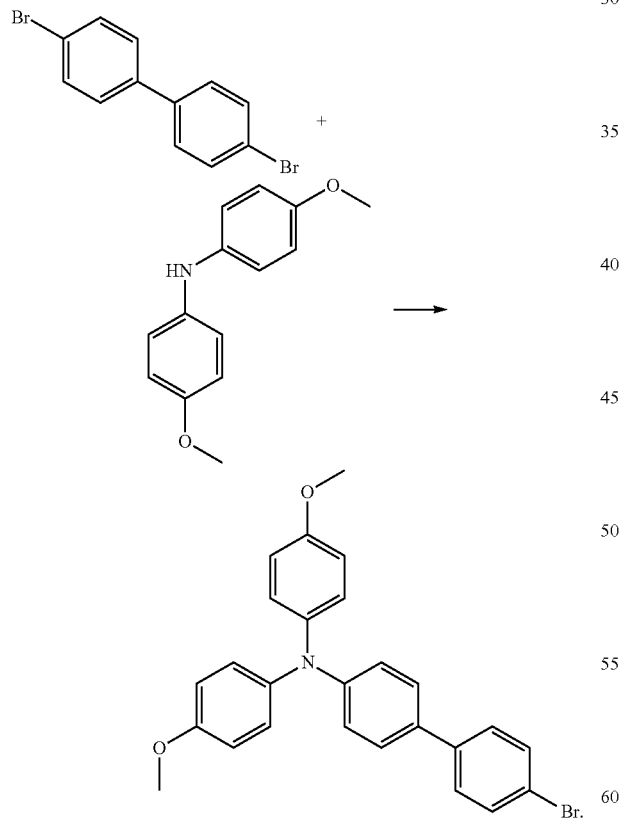

4,4'-Dibromobiphenyl (20 mmol), 4,4-dimethoxydiphenylamine (24 mmol), Pd$_2$(dba)$_3$ (0.4 mmol), Cs$_2$CO$_3$ (40 mmol), tri-tert-butylphosphine (1.6 mmol), and 200 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was stirred for 24 h at 110° C. After the reaction was completed, the mixture was extracted with saturated saline (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:4, in a volume ratio) to obtain 8 g of product N4,N4-bis(4-methoxyphenyl)-[1,1'-biphenyl]-4-amine with a yield of 86.9%.

$^1$HNMR (CDCl$_3$, 400 MHz): δ 3.77 (6H, s), 6.71 (4H, ddd, J=8.7, 2.7, 0.5 Hz), 6.91-7.15 (6H, 6.97 (ddd, J=8.9, 1.5, 0.5 Hz), 7.09 (ddd, J=8.7, 1.3, 0.5 Hz)), 7.27-7.43 (4H, 7.33 (ddd, J=8.7, 1.4, 0.5 Hz), 7.37 (ddd, J=8.9, 1.5, 0.5 Hz)), 7.53 (2H, ddd, J=8.7, 1.7, 0.5 Hz).

Step S5: Synthesis of N4,N4,N4'-tris(4-methoxyphenyl)-[1,1'-biphenyl]-4,4'-diamine

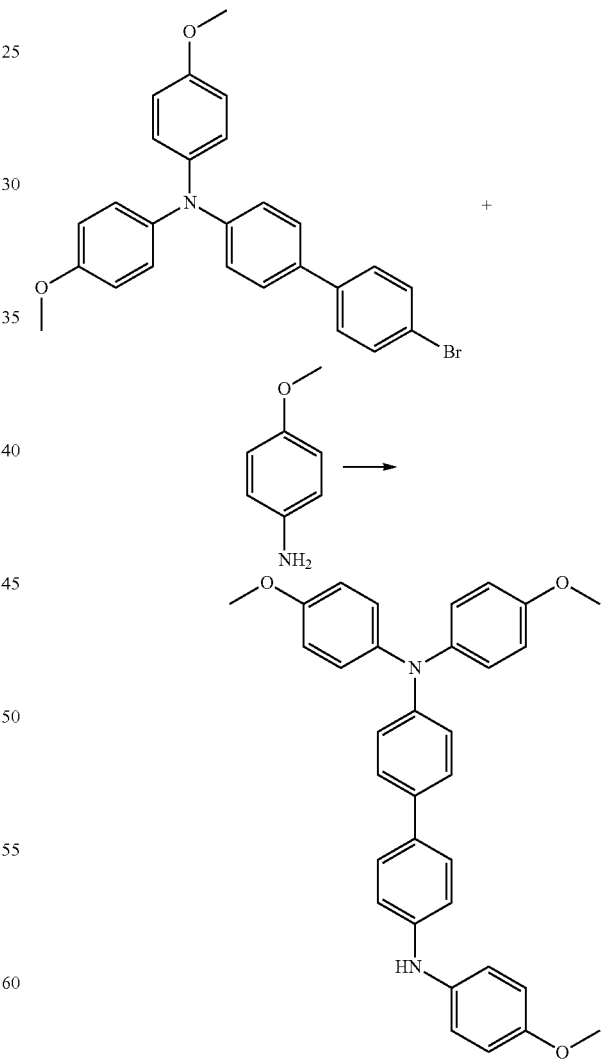

The N4,N4-bis(4-methoxyphenyl)-[1,1'-biphenyl]-4-amine (20 mmol) prepared in Step S4, p-methoxyaniline (24 mmol), Pd$_2$(dba)$_3$ (0.4 mmol), Cs$_2$CO$_3$ (40 mmol), tri-tertbutylphosphine (1.6 mmol) and 200 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was reacted for 24 h at 110° C. After the reaction was completed, the mixture was extracted with saturated saline (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:2, in a volume ratio) to obtain 8.12 g of product N4,N4,N4'-tris(4-methoxyphenyl)-[1,1'-biphenyl]-4,4'-diamine with a yield of 80.84%.

$^1$HNMR (CDCl$_3$, 400 MHz): δ 3.70-3.82 (9H, 3.75 (s), 3.77 (s)), 6.63-6.78 (6H, 6.69 (ddd, J=8.7, 2.7, 0.5 Hz), 6.71 (ddd, J=8.7, 2.7, 0.5 Hz)), 7.01 (2H, ddd, J=8.7, 1.3, 0.5 Hz), 7.14-7.38 (6H, 7.20 (ddd, J=9.0, 1.8, 0.5 Hz), 7.31 (ddd, J=9.0, 1.2, 0.5 Hz), 7.32 (ddd, J=8.8, 1.8, 0.6 Hz)), 7.43-7.66 (6H, 7.49 (ddd, J=8.8, 1.6, 0.6 Hz), 7.60 (ddd, J=8.7, 1.3, 0.5 Hz)).

Step S6: 5'-(4-(bis(4-ethylphenyl)amino)phenyl)-N4-(4'-(bis(4-methoxyphenyl)amino)-[1,1'-biphenyl]-4-yl)-N4,N4',N4'-tris(4-methoxyphenyl)-[1,1':3',1'-triphenyl]-4,4'-diamine (formula(I-1))

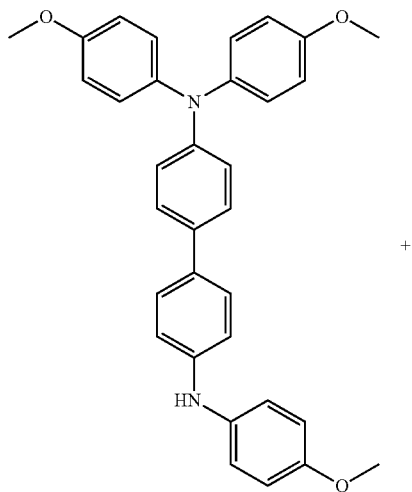

+

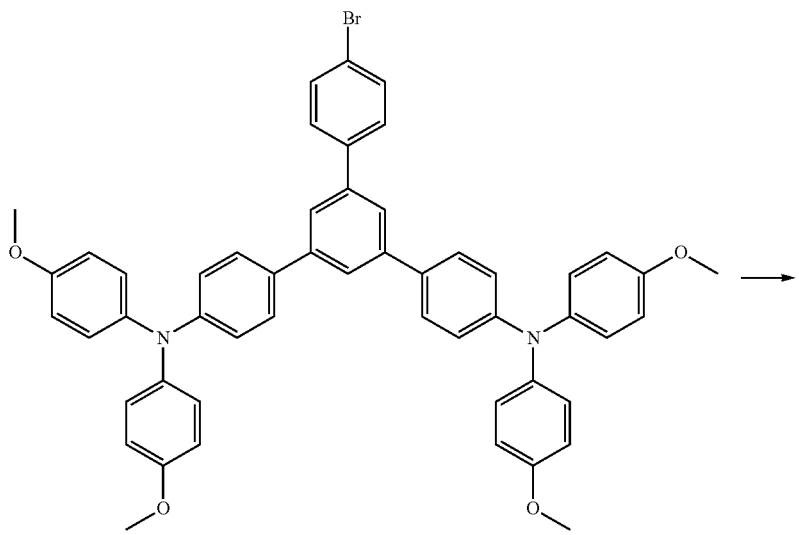

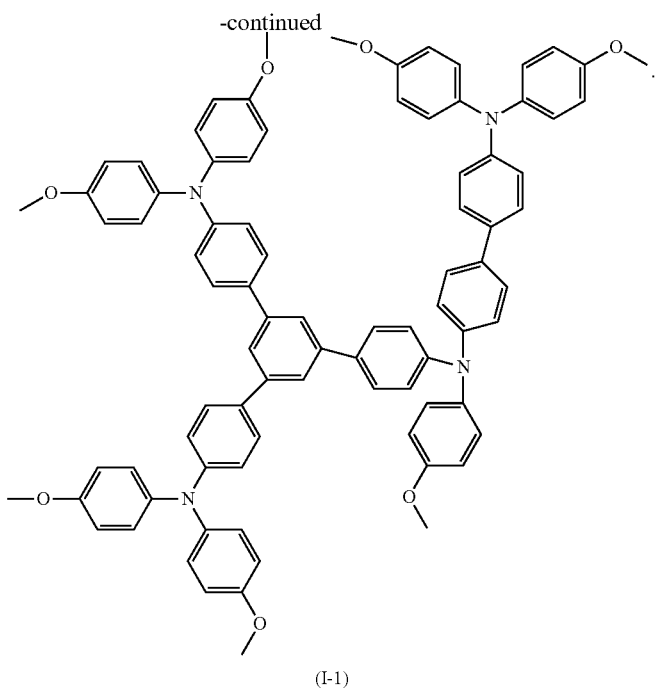

(I-1)

The N4,N4,N4'-tris(4-methoxyphenyl)-[1,1'-biphenyl]-4,4'-diamine prepared in Step S5, the 5'-(4-bromophenyl)-N4,N4,N4', N4'-tetrakis(4-methoxyphenyl)-[1,1':3',1'-triphenyl]-4,4'-diamine (1 mmol) prepared in Step S3, $Pd_2(dba)_3$ (0.2 mmol), $Cs_2CO_3$ (20 mmol), tri-tert-butylphosphine (0.8 mmol) and 100 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was reacted for 24 h at 110° C. After the reaction was completed, the mixture was extracted with saturated saline (50 ml each time, 4 times in total). An organic layer was dried by anhydrous $MgSO_4$, filtered, and evaporated to dryness under reduced pressure to obtain a crude product. The crude product was separated by column chromatography (a stationary phase was 200-300 mesh silica gel, and a mobile phase was dichloromethane:n-hexane=1:2, in a volume ratio) to obtain 0.3 g of product of formula (I-1) with a yield of 23.81%.

$^1$H NMR (CDCl$_3$, 400 MHz): δ 3.70-3.80 (21H, 3.75 (s), 3.75 (s), 3.75 (s)), 6.65-6.78 (12H, 6.71 (ddd, J=8.7, 2.7, 0.5 Hz), 6.71 (ddd, J=8.7, 2.7, 0.5 Hz)), 6.87 (2H, ddd, J=8.7, 2.7, 0.5 Hz), 7.02-7.41 (24H, 7.08 (ddd, J=8.7, 1.3, 0.5 Hz), 7.21 (ddd, J=8.9, 1.5, 0.5 Hz), 7.29 (ddd, J=8.8, 1.7, 0.5 Hz), 7.31 (ddd, J=8.9, 1.7, 0.5 Hz), 7.34 (ddd, J=8.9, 1.6, 0.5 Hz), 7.34 (ddd, J=8.9, 1.6, 0.5 Hz), 7.35 (ddd, J=8.9, 1.6, 0.5 Hz)), 7.44-7.71 (10H, 7.50 (ddd, J=8.9, 1.5, 0.5 Hz), 7.53 (ddd, J=8.8, 1.6, 0.5 Hz), 7.60 (ddd, J=8.7, 1.5, 0.5 Hz), 7.64 (ddd, J=8.7, 1.5, 0.5 Hz)), 7.93-8.04 (3H, 7.99 (t, J=1.9 Hz), 7.99 (t, J=1.9 Hz)).

Example 2: Synthesis of (E)-5'-(4-(bis(4-methoxyphenyl)amino)phenyl)-N4-(4-(4-bis(4-methoxyphenyl)amino)styryl)phenyl)-N4,N4'',N4''-tris(4-methoxyphenyl)-[1,1:3',1'-triphenyl]-4,4'-diamine (compound of formula (I-2))

Step S4-2: Synthesis of (E)-4-(4-bromostyryl)-N,N-bis(4-methoxyphenyl)aniline

Step a): Synthesis of 1,2-bis(4-bromophenyl)ethylene

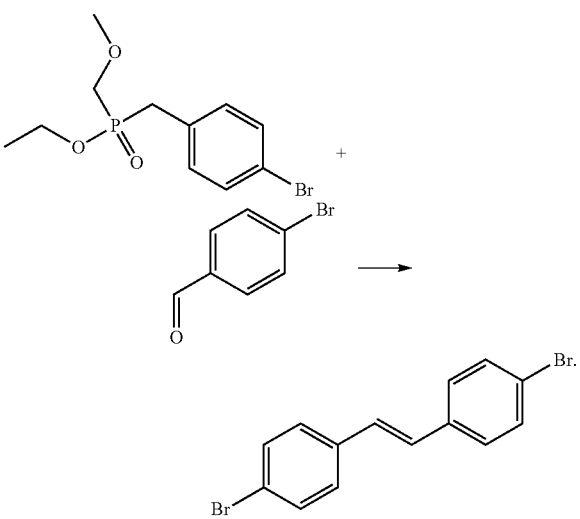

Diethyl (4-bromobenzyl)phosphonate (2.71 g, 11.0 mmol, purchased from Bide Pharmatech, CAS: 38186-51-5), potassium tert-butoxide (3.37 g, 30.0 mmol), and 20 mL of tetrahydrofuran (20 mL) were sequentially added to a round-bottom flask. In an ice water bath, the reaction mixture was stirred for 5 min, and then added with 4-bromobenzaldehyde (1.85 g, 10.0 mmol). The solution was kept at 0° C. and continually stirred for 5 h, and added with 10 mL of ice water to stop the reaction. The solution was then extracted (50 ml each time, 3 times in total). An organic layer was dried by anhydrous MgSO$_4$, filtered, and concentrated under reduced pressure to obtain a crude product. The crude product was separated by column chromatography (a stationary phase was 200-300 mesh silica gel, and a mobile phase was ethyl acetate:petroleum ether=1:8, in a volume ratio) to obtain 3.12 g of product 1,2-bis(4-bromophenyl)ethylene with a yield of 84.44%.

Step b): Synthesis of (E)-4-(4-bromostyryl)-N,N-bis(4-methoxyphenyl)aniline

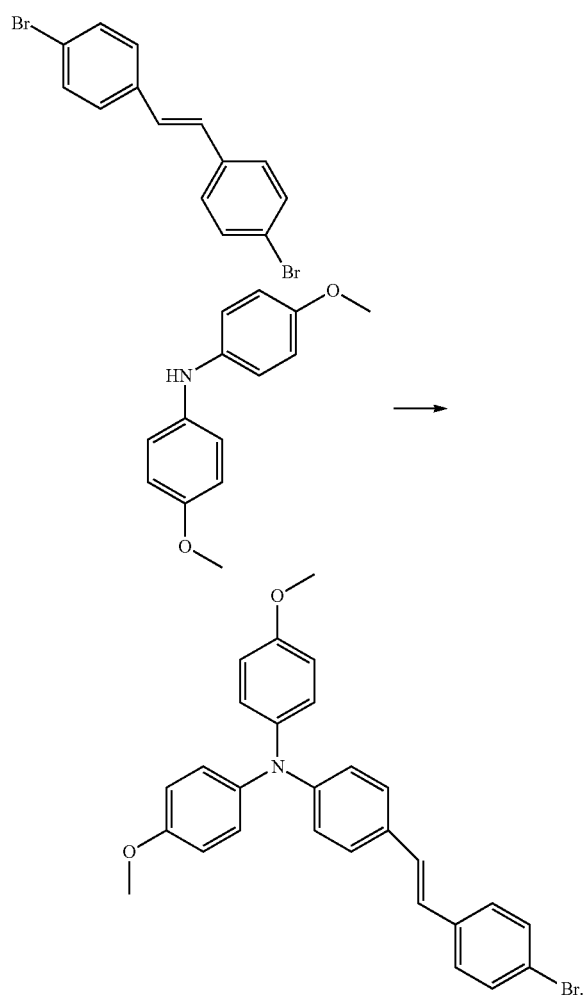

The 1,2-bis(4-bromophenyl)ethylene (10 mmol) synthesized in Step a), 4,4-dimethoxydiphenylamine (12 mmol), Pd$_2$(dba)$_3$ (0.2 mmol), Cs$_2$CO$_3$ (20 mmol), tri-tert-butylphosphine (0.8 mmol), and 100 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was stirred for 24 h at 110° C. After the reaction was completed, the mixture was extracted with saturated saline (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:4, in a volume ratio) to obtain 5.12 g of (E)-4-(4-bromostyryl)-N,N-bis(4-methoxyphenyl)aniline with a yield of 52.78%.

$^1$HNMR (CDCl$_3$, 400 MHz): δ 3.75 (6H, s), 6.58 (2H, ddd, J=8.2, 2.3, 0.5 Hz), 6.72 (4H, ddd, J=8.7, 2.7, 0.5 Hz), 6.97-7.27 (10H, 7.03 (d, J=13.9 Hz), 7.09 (ddd, J=8.4, 1.9, 0.5 Hz), 7.09 (ddd, J=8.7, 1.5, 0.5 Hz), 7.12 (d, J=13.9 Hz), 7.21 (ddd, J=8.2, 1.9, 0.5 Hz)), 7.37 (2H, ddd, J=8.4, 1.5, 0.5 Hz).

Step S5-2: Synthesis of (E)-4-methoxyl-N-(4-methoxyphenyl)-N-(4-(4-(4-methoxyphenyl)amino)styryl)phenyl)aniline

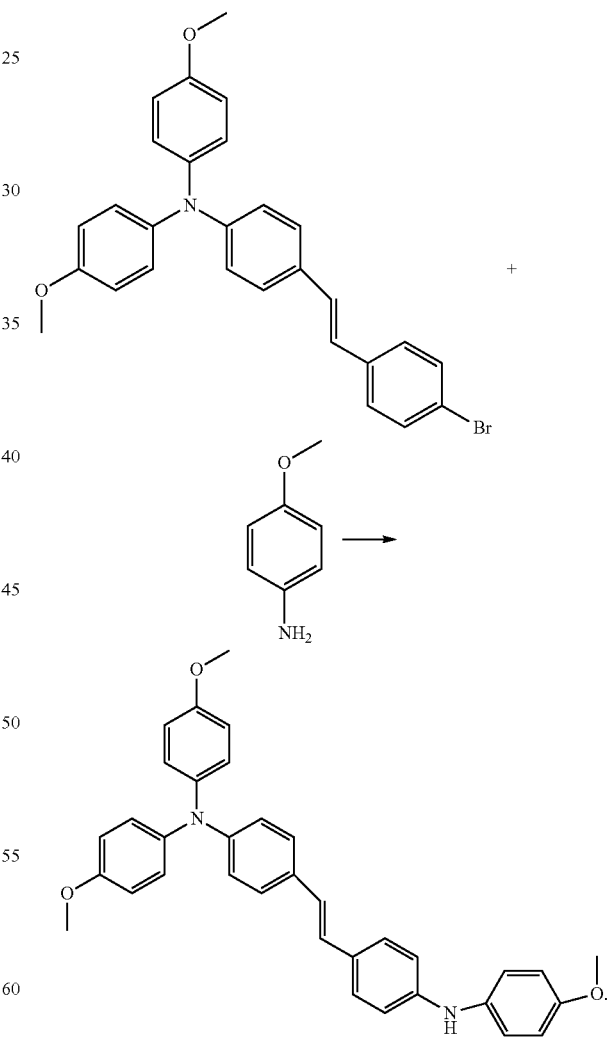

The (E)-4-(4-bromostyryl)-N,N-bis(4-methoxyphenyl) aniline (10 mmol) prepared in Step S4-2, p-methoxyaniline (12 mmol), Pd$_2$(dba)$_3$ (0.2 mmol), Cs$_2$CO$_3$ (20 mmol), tri-tert-butylphosphine (0.8 mmol) and 100 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was reacted for 24 h at 110° C. After the reaction was completed, the mixture was extracted with saturated saline (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:4, in a volume ratio) to obtain 3.56 g of product (E)-4-methoxyl-N-(4-methoxyphenyl)-N-(4-(4-(4-methoxyphenyl)amino)styryl)phenyl)aniline with a yield of 67.4%.

$^1$HNMR (CDCl$_3$, 400 MHz): δ 3.70-3.81 (9H, 3.75 (s), 3.76 (s)), 6.56-6.90 (8H, 6.62 (ddd, J=8.8, 2.7, 0.5 Hz), 6.72 (ddd, J=8.7, 2.7, 0.5 Hz), 6.84 (ddd, J=8.3, 1.4, 0.5 Hz)), 6.90-7.30 (14H, 6.97 (d, J=14.1 Hz), 7.00 (d, J=14.1 Hz), 7.02 (ddd, J=8.8, 1.4, 0.5 Hz), 7.09 (ddd, J=8.7, 1.5, 0.5 Hz), 7.20 (ddd, J=8.3, 2.1, 0.5 Hz), 7.22 (ddd, J=8.3, 1.9, 0.5 Hz), 7.24 (ddd, J=8.3, 2.0, 0.5 Hz)).

Step S6-2: Synthesis of (E)-5'-(4-(bis(4-methoxyphenyl)amino)phenyl)-N4-(4-(4-(4-methoxyphenyl)amino)styryl)phenyl)-N4,N4'',N4''-tris(4-methoxyphenyl)-[1,1:3',1'-triphenyl]-4,4'-diamine (formula (I-2))

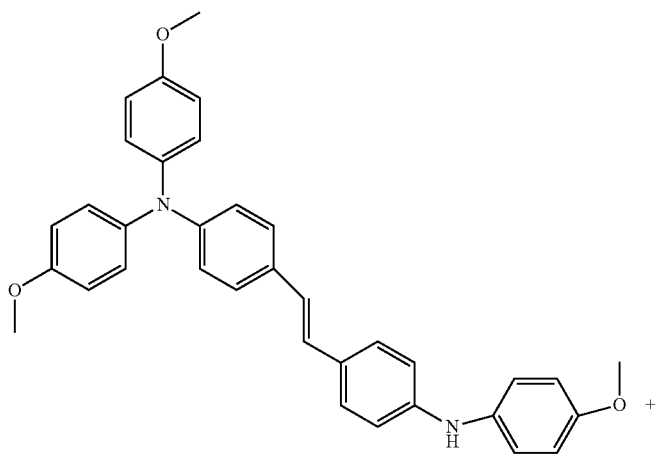

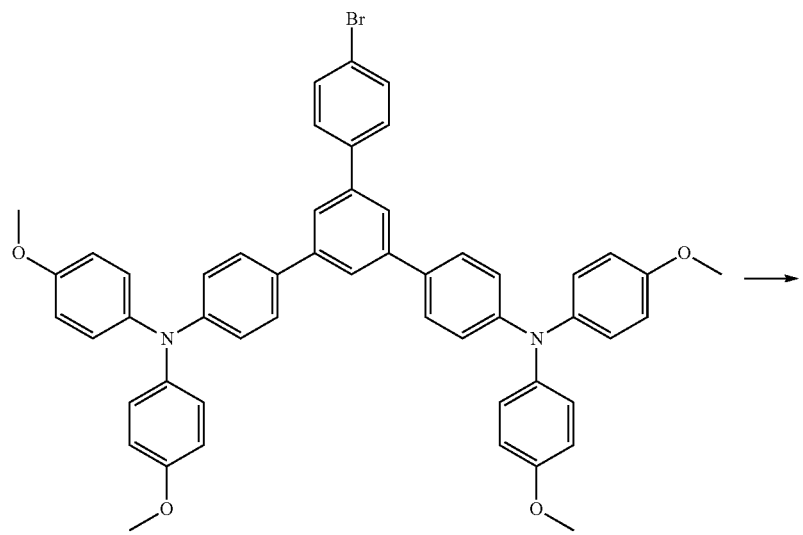

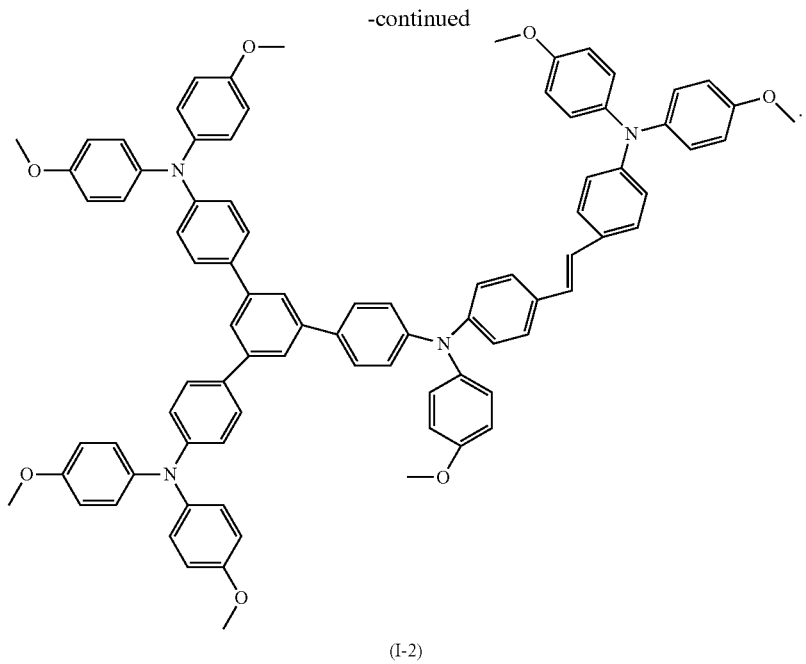

(I-2)

The (E)-4-methoxyl-N-(4-methoxyphenyl)-N-(4-(4-(4-(4-methoxyphenyl)amino)styryl)phenyl)aniline (1 mmol) prepared in Step S5-2, the 5'-(4-bromophenyl)-N4,N4,N4', N4'-tetrakis(4-methoxyphenyl)-[1,1':3', 1'-triphenyl]-4,4'-diamine (1 mmol) prepared in Step S3 in Example 1, $Pd_2(dba)_3$ (0.2 mmol), $Cs_2CO_3$ (20 mmol), tri-tert-butylphosphine (0.8 mmol) and 100 ml of toluene were added to a Schlenk tube. Then, the Schlenk tube was vacuumed and introduced with argon, and the operation was repeated 3 times to keep the Schlenk tube filled with argon. Under argon, the reaction mixture was reacted for 24 h at 110° C. After the reaction was completed, the mixture was extracted with saturated saline (50 ml each time, 4 times in total). An organic layer was dried by anhydrous $MgSO_4$, filtered, and evaporated to dryness under reduced pressure to obtain a crude product. The crude product was separated by column chromatography (a stationary phase was 200-300 mesh silica gel, and a mobile phase was dichloromethane: petroleum ether=1:2, in a volume ratio) to obtain 0.5 g of product of formula (I-2) with a yield of 38.9%.

$^1$H NMR ($CDCl_3$, 400 MHz): δ 3.70-3.80 (21H, 3.75 (s), 3.75 (s), 3.75 (s)), 6.65-6.78 (12H, 6.71 (ddd, J=8.7, 2.7, 0.5 Hz), 6.72 (ddd, J=8.7, 2.7, 0.5 Hz)), 6.81-7.16 (20H, 6.87 (ddd, J=8.7, 2.6, 0.5 Hz), 6.87 (ddd, J=8.3, 1.6, 0.5 Hz), 6.94 (ddd, J=8.7, 1.5, 0.5 Hz), 7.03 (d, J=13.9 Hz), 7.04 (d, J=13.9 Hz), 7.08 (ddd, J=8.7, 1.3, 0.5 Hz), 7.09 (ddd, J=8.7, 1.5, 0.5 Hz)), 7.17-7.41 (18H, 7.23 (ddd, J=8.3, 1.9, 0.5 Hz), 7.24 (ddd, J=8.3, 2.1, 0.5 Hz), 7.24 (ddd, J=8.3, 1.9, 0.5 Hz), 7.28 (ddd, J=8.9, 1.5, 0.5 Hz), 7.34 (ddd, J=8.9, 1.6, 0.5 Hz), 7.34 (ddd, J=8.9, 1.6, 0.5 Hz), 7.35 (ddd, J=8.9, 1.6, 0.5 Hz)), 7.94-8.04 (3H, 7.99 (t, J=1.9 Hz), 7.99 (t, J=1.9 Hz)).

Example 3: Synthesis of 5'-(4-(bis(4-methoxyphenyl)amino)phenyl)-N4-(4-(5-(4-(bis(4-methoxyphenyl)amino)phenyl)thiophen-2-yl)phenyl)-N4,N4", N4'-tris(4-methoxyphenyl)-(1,1:3',1'-triphenyl]-4,4'-diamine (a compound of formula (I-3))

Step S4-3: Synthesis of 4-(5-(4-bromophenyl)thiophen-2-yl)-N,N-bis(4-methoxyphenyl)aniline Step a): Synthesis of 2,5-bis(4-bromophenyl)thiophene

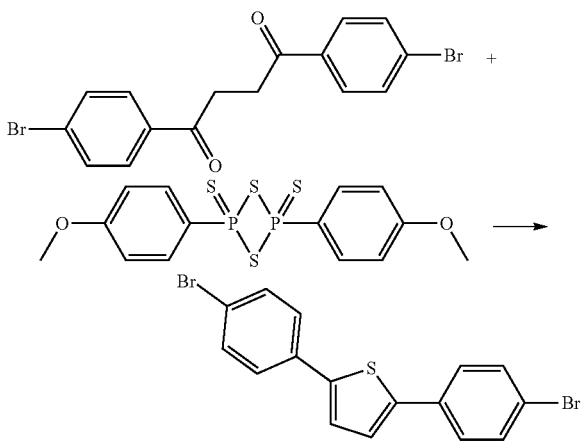

1,4-Bis(4-bromophenyl)butane-1,4-dione (4.023 gmg, 10 mmol, purchased from Bide Pharmatech, CAS: 2461-83-8) and a Lawesson reagent (6.362 g, 15 mmol, purchased from Bide Pharmatech, CAS: 19172-47-5) were added to a round-bottom flask. Then, the Schlenk tube was vacuumed and introduced with argon, and the operation was repeated 3 times to keep the Schlenk tube filled with argon. Under argon, 60 ml of hexafluoroisopropanol (purchased from Bide Pharmatech, CAS: 920-66-1) was added. Under argon, the reaction mixture was reacted under reflux for 18 h. After the reaction was completed, it was evaporated to dryness to obtain a crude product. The crude product was separated by column chromatography (a stationary phase was 200-300 mesh silica gel, and a mobile phase was ethyl acetate:n-hexane=1:8, in a volume ratio) to obtain 3.85 g of product 2,5-bis(4-bromophenyl)thiophene with a yield of 98.21%.

$^1$HNMR (CDCl$_3$, 400 MHz): δ 7.26-7.42 (6H, 7.33 (ddd, J=8.7, 1.5, 0.5 Hz), 7.36 (d, J=8.8 Hz)), 7.53 (4H, ddd, J=8.7, 1.5, 0.5 Hz).

Step b): Synthesis of 4-(5-(4-bromophenyl)thiophene-2-yl)-N,N-bis(4-methoxyphenyl)aniline

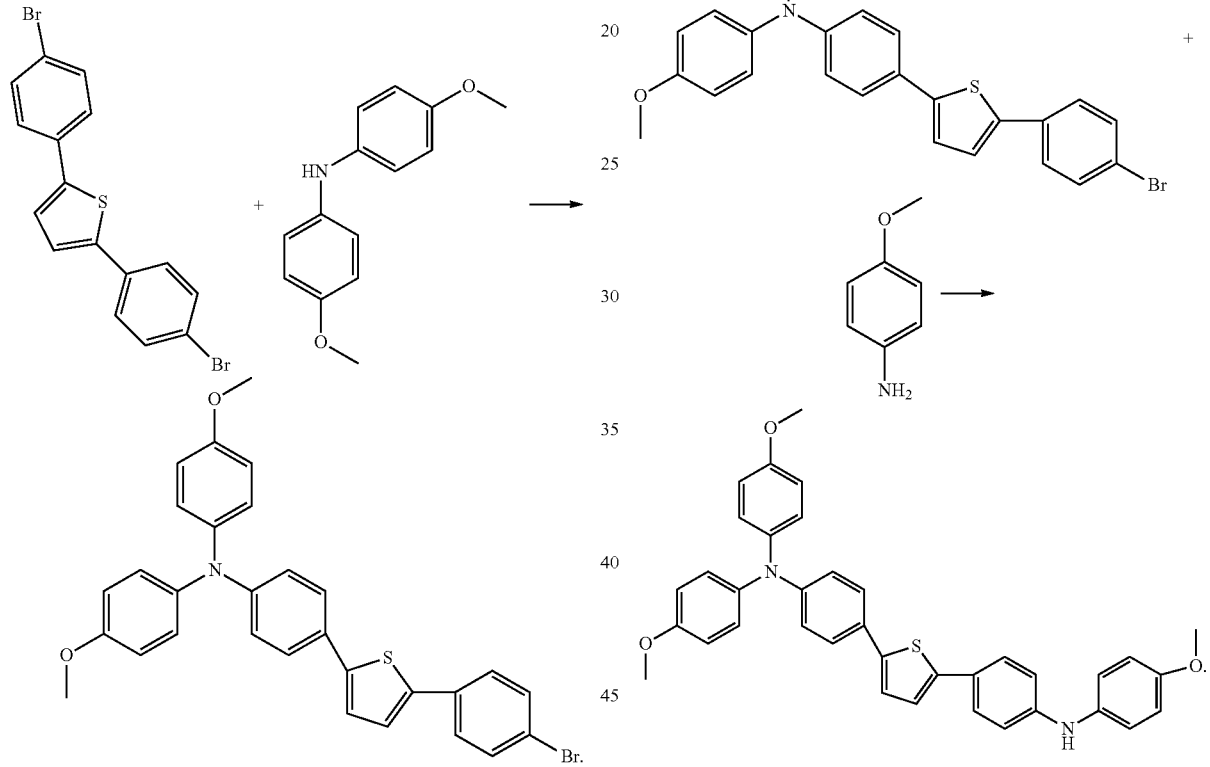

The 2,5-bis(4-bromophenyl)thiophene (10 mmol) prepared in Step a), 4,4-dimethoxydiphenylamine (12 mmol), Pd$_2$(dba)$_3$ (0.2 mmol), Cs$_2$CO$_3$ (20 mmol), tri-tert-butylphosphine (0.8 mmol), and 100 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was stirred for 24 h at 110° ° C. After the reaction was completed, the mixture was extracted with saturated saline (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:4, in a volume ratio) to obtain 3.89 g of 4-(5-(4-bromophenyl)thiophene-2-yl)-N,N-bis(4-methoxyphenyl) aniline with a yield of 71.77%.

$^1$HNMR (CDCl$_3$, 400 MHz): δ 3.75 (6H, s), 6.71 (4H, ddd, J=8.7, 2.7, 0.5 Hz), 7.09 (4H, ddd, J=8.7, 1.3, 0.5 Hz), 7.17-7.56 (10H, 7.23 (d, J=8.5 Hz), 7.30 (d, J=8.5 Hz), 7.38 (ddd, J=8.7, 1.5, 0.5 Hz), 7.40 (ddd, J=8.9, 1.5, 0.5 Hz), 7.45 (ddd, J=8.9, 1.6, 0.5 Hz), 7.50 (ddd, J=8.7, 1.6, 0.5 Hz)).

Step S5-3: Synthesis of 4-methoxyl-N-(4-methoxyphenyl)-N-(4-(5-(4-(4-methoxyphenyl)amino)phenyl)thiophen-2-yl)phenyl)aniline The 4-(5-(4-bromophenyl)thiophen-2-yl)-N,N-bis(4-methoxyphenyl)aniline (10 mmol) prepared in Step S4-3, p-methoxyaniline (12 mmol), Pd$_2$(dba)$_3$ (0.2 mmol), Cs$_2$CO$_3$ (20 mmol), tri-tert-butylphosphine (0.8 mmol) and 100 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was reacted for 24 h at 110° C. After the reaction was completed, the mixture was extracted with saturated saline (50 ml each time, 4 times in total). An organic layer was dried by anhydrous MgSO$_4$, filtered, and evaporated to dryness under reduced pressure to obtain a crude product. The crude product was separated by column chromatography (a stationary phase was 200-300 mesh silica gel, and a mobile phase was ethyl acetate:n-hexane=1:4) to obtain 4.12 g of product 4-methoxyl-N-(4-methoxyphenyl)-N-(4-(5-(4-(4-methoxyphenyl)amino)phenyl)thiophen-2-yl)phenyl)aniline with a yield of 70.46%.

¹HNMR (CDCl₃, 400 MHz): δ 3.69-3.80 (9H, 3.74 (s), 3.75 (s)), 6.56-6.78 (6H, 6.63 (ddd, J=8.8, 2.7, 0.5 Hz), 6.71 (ddd, J=8.7, 2.7, 0.5 Hz)), 6.99 (2H, ddd, J=8.8, 1.6, 0.5 Hz), 7.22-7.40 (6H, 7.29 (ddd, J=9.0, 1.5, 0.5 Hz), 7.30 (ddd, J=8.9, 1.5, 0.5 Hz), 7.31 (d, J=8.5 Hz), 7.34 (d, J=8.5 Hz)), 7.43-7.66 (8H, 7.50 (ddd, J=9.0, 1.4, 0.5 Hz), 7.53 (ddd, J=8.9, 1.7, 0.5 Hz), 7.60 (ddd, J=8.7, 1.3, 0.5 Hz)).
Step S6-3: Synthesis of 5'-(4-(bis(4-methoxyphenyl)amino)phenyl)-N4-(4-(5-(4-bis(methoxyphenyl)amino)phenyl)thiophen-2-yl)phenyl)-N4,N4'', N4'-tris(4-methoxyphenyl)-(1,1:3',1'-triphenyl]-4,4'-diamine (formula(I-3))
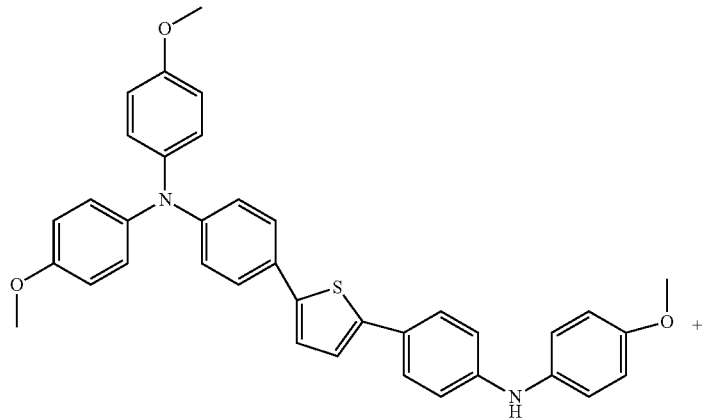
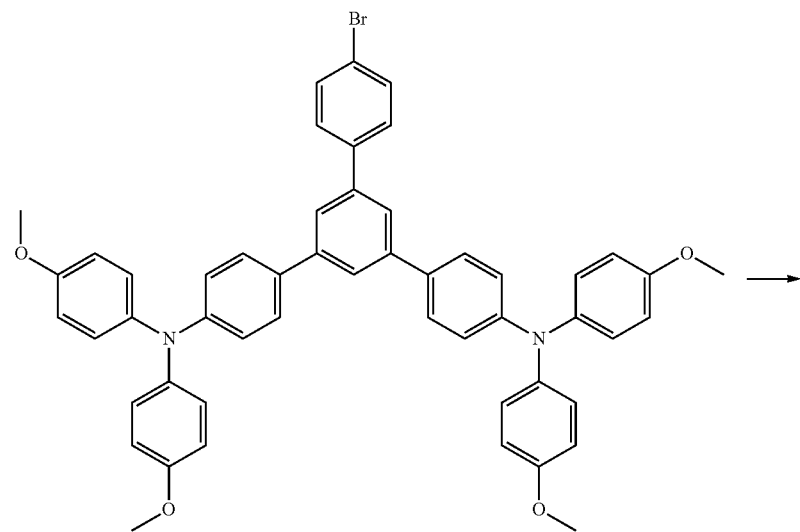

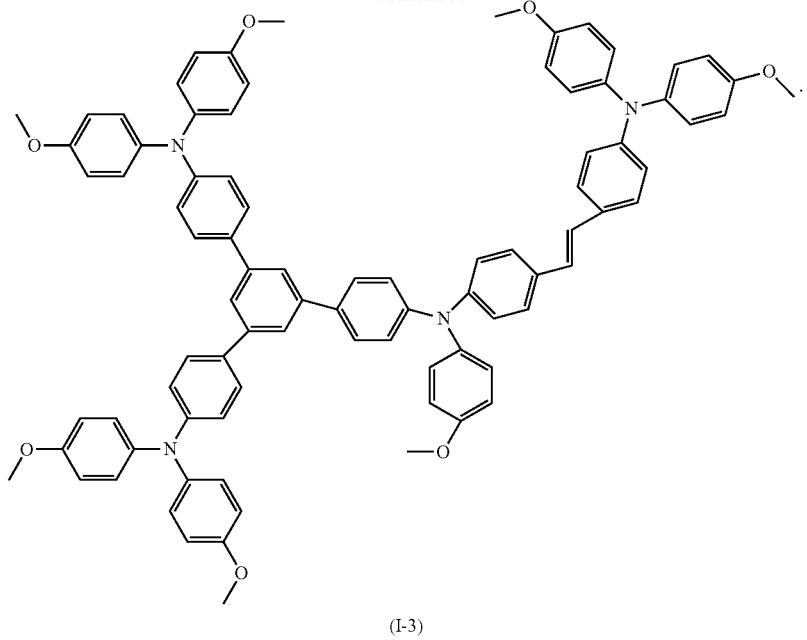

(I-3)

The 4-methoxyl-N-(4-methoxyphenyl)-N-(4-(5-(4-(4-methoxyphenyl)amino)phenyl)thiophen-2-yl)phenyl)aniline (1 mmol) prepared in Step S5-3, the 5'-(4-bromophenyl)-N4,N4,N4',N4'-tetrakis(4-methoxyphenyl)-[1,1':3',1'-triphenyl]-4,4'-diamine (1 mmol) prepared in Step S3 in Example 1, $Pd_2(dba)_3$ (0.2 mmol), $Cs_2CO_3$ (20 mmol), tri-tert-butylphosphine (0.8 mmol) and 100 ml of toluene were sequentially added to a Schlenk tube. Then, the Schlenk tube was vacuumed and introduced with argon, and the operation was repeated 3 times to keep the Schlenk tube filled with argon. Under argon, the reaction mixture was stirred for 24 h at 110° C. After the reaction was completed, the mixture was extracted with saturated saline (50 ml each time, 4 times in total). An organic layer was dried by anhydrous $MgSO_4$, filtered, and evaporated to dryness under reduced pressure to obtain a crude product. The crude product was separated by column chromatography (a stationary phase was 200-300 mesh silica gel, and a mobile phase was dichloromethane: petroleum ether=1:2, in a volume ratio) to obtain 0.52 g of product of formula (I-3) with a yield of 38.74%.

$^1$H NMR ($CDCl_3$, 400 MHz): δ 3.70-3.80 (21H, 3.75 (s), 3.75 (s), 3.75 (s)), 6.65-6.79 (12H, 6.71 (ddd, J=8.7, 2.7, 0.5 Hz), 6.72 (ddd, J=8.7, 2.7, 0.5 Hz)), 6.87 (2H, ddd, J=8.7, 2.7, 0.5 Hz), 7.02-7.43 (28H, 7.08 (ddd, J=8.7, 1.3, 0.5 Hz), 7.11 (ddd, J=8.7, 1.5, 0.5 Hz), 7.22 (ddd, J=8.9, 1.5, 0.5 Hz), 7.34 (ddd, J=8.9, 1.6, 0.5 Hz), 7.34 (ddd, J=8.9, 1.6, 0.5 Hz), 7.35 (ddd, J=8.9, 1.6, 0.5 Hz), 7.36 (ddd, J=8.9, 1.5, 0.5 Hz), 7.36 (ddd, J=9.0, 1.5, 0.5 Hz), 7.36 (d, J=8.6 Hz), 7.37 (d, J=8.6 Hz)), 7.45-7.66 (8H, 7.51 (ddd, J=9.0, 1.9, 0.5 Hz), 7.52 (ddd, J=8.9, 1.6, 0.5 Hz), 7.60 (ddd, J=8.7, 1.5, 0.5 Hz)), 7.94-8.04 (3H, 7.99 (t, J=1.9 Hz), 7.99 (t, J=1.9 Hz)).

III. Preparation of Perovskite Cell

Device Example 1

1) 2.0 cm×2.0 cm of FTO conductive glass was taken, and 0.35 cm of FTO at each of two ends was removed by laser etching to expose a glass substrate.
2) The etched FTO conductive glass was ultrasonically cleaned for several times sequentially with water, acetone and isopropanol.
3) The FTO conductive glass was blown under a nitrogen gun to dry a solvent and placed into a UV ozone machine for further cleaning.
4) The same volume of water was mixed with a $SnO_2$ aqueous solution (purchased from sigma) to obtain a $SnO_2$ diluent; 70 μL of $SnO_2$ solution was taken, spin-coated onto a FTO layer at 3000 rpm/s, annealed at 100° ° C. for 30 min after spin coating, and cooled to room temperature, so as to form an electron transport layer with a thickness of 20 nm.
5) 0.5531 g of plumbum iodide, 0.1842 g of formamidine iodide, 0.0156 g of cesium iodide, 0.1255 g of methylammonium bromide, 0.1213 g of plumbum bromide were weighed and dissolved in a mixed solution (1 mL) of DMF and DMSO in a volume ratio of 1:4, stirred for 3 h, and filtered with a 0.22 μm organic filter membrane to obtain a perovskite precursor solution; 0.1 mL of perovskite precursor solution was spin-coated onto a $SnO_2$ layer at 3000 rpm/s, annealed at 100° ° C. for 30 min, and cooled to room temperature, thereby forming a perovskite layer with a thickness of 500 nm; and a chemical formula of perovskite was $(Cs_{0.05}FA_{0.93}MA_{0.02})Pb(I0.98Br_{0.02})_3$, wherein the plumbum iodide, formamidine iodide, cesium iodide, methylammonium bromide, and plumbum bromide were purchased from Xi'an p-OLED Optoelectronic Materials Co., Ltd., and DMF and DMSO were purchased from Sigma.

6) 0.1 g of hole transport layer material of formula (I-1) was weighed and dissolved in 2 ml of chlorobenzene to obtain a hole transport layer solution, and the hole transport layer solution (60 μL) was spin-coated onto a perovskite absorption layer at 3000 rpm/s; and accordingly, a hole transport layer with a thickness of 60 nm was formed.

7) The preparation parts previously obtained by steps 1)-6) including the FTO conductive glass, the electron transport layer, the perovskite layer and the hole transport layer were scraped with a blade according to a mask pattern to remove a part of functional layers (including the electron transport layer, the perovskite layer and the hole transport layer) to expose the conductive glass layer; the remaining functional layers were then wiped off with a washing solution; then, this object was placed into an evaporation mask plate, and 80 nm of silver was evaporated on the exposed conductive glass in vacuum evaporation equipment with an evaporation rate of 0.1 A/s; and after evaporation, a complete perovskite solar cell was obtained.

Device Example 2

A preparation process of a perovskite solar cell as a whole refers to device example 1, with the difference residing in that in the preparation of the hole transport layer of Step 6) in this example, the compound (0.1 g) of formula (I-2) of the present disclosure was used instead of the compound of formula (I-1). Thus, a perovskite solar cell of device example 2 was prepared.

Device Example 3

A preparation process of a perovskite solar cell as a whole refers to device example 1, with the difference residing in that in the preparation of a hole transport layer of Step 6) in this example, the compound (0.1 g) of formula (1-3) of the present disclosure was used instead of the compound of formula (I-1). Thus, a perovskite solar cell of device example 2 was prepared.

Device Comparative Example 1

A preparation process of a perovskite solar cell as a whole refers to device example 1, with the difference residing in that in the preparation of a hole transport layer of step 6) of the comparative example, the compound spiro-OMeTAD of formula (A) (0.1 g, purchased from Xi'an p-OLED Optoelectronic Materials Co., Ltd.) was used instead of the compound (I-1) (0.1 g) of the present disclosure. Thus, a perovskite cell in the comparative device example 1 was prepared.

Device Comparative Example 2

The preparation process of a perovskite solar cell as a whole refers to device example 1, with the difference residing in that the preparation of a hole transport layer of Step 6) in this comparative example was as follows:

an additive 4-tert-butylpyridine (TBP) (30 μg), an acetonitrile solution (18 μL) of bis(trifluoromethanesulfonyl)lithium (Li-TFSI) having a concentration of 520 mg/mL and an acetonitrile solution (29 μL) of FK209 having a concentration of 300 mg/mL were added to 1 mL of chlorobenzene solution of compound spiro-OMeTAD of formula (A) (73 mg, purchased from Xi'an p-OLED Optoelectronic Materials Co., Ltd.) to obtain a hole transport layer solution; the hole transport layer solution (60 μL) was then spin-coated onto the perovskite absorber layer at 3000 rpm/s; and thus, a perovskite cell in the comparative device example 2 was prepared.

Test Method

1. HOMO Energy Level Determination Method

A sample preparation method includes: taking a cleaned glass sheet, spin-coating a material to be tested onto the glass sheet (rather than a perovskite absorption layer) according to Examples 1-3 and Comparative examples 1-2, and annealing to obtain a thin film of the material to be tested.

The above prepared sample was determined by ultraviolet photoelectron spectroscopy UPS (AXIS ULTRADLD of Kratos Company) to obtain a HOMO energy level of the material to be tested, which was the HOMO energy level of the hole transport layer.

The compound of formula (I-1) of the present disclosure has a HOMO energy level of −5.2 eV, the compound of formula (I-2) has a HOMO energy level of −5.1 eV, and the compound of formula (I-3) has a HOMO energy level of −5.2 eV. The commonly used hole transport material spiro-OMeTAD has a HOMO energy level of −5.0 eV. The commonly used composition material containing spiro-OMeTAD and additives TBP, Li-TFSI and FK209 has a HOMO energy level of −5.1 eV.

2. Hole Mobility Determination Method

The hole mobility of the hole transport layer material was determined by a space charge limiting current (SCLC) method, according to a method described in the literature (Synthesis and Device Characterization of A High-mobility Material for Polymer Solar Cells [J]. Yang Dalei, et al.; Applied Chemistry, 33(12): 1375-1382), and the thickness of the hole transport layer was 60 nm. Therefore, the hole mobility of the tested material, that is, the hole mobility of the hole transport layer, was obtained. The structure of a test device (PEDOT:PSS)/hole was ITO/poly3,4-ethylenedioxythiophene-polystyrene sulfonate transport layer/Au.

A preparation process of the test device was as follows:

ITO glass was ultrasonically cleaned sequentially in an aqueous solution of detergent, secondary water, isopropanol and acetone for 20 min, and then the cleaned ITO glass was dried with high-purity N2 gas, placed into a UV-ozone cleaning machine and processed for 30 min. Then, a layer of PEDOT:PSS interface with a thickness of 30 nm was spin-coated on the cleaned ITO glass by using a spin-coating machine, and then the ITO glass spin-coated with PEDOT:PSS is baked on a hot stage at 150° C. under atmospheric environment for 15 min to ensure that there was no moisture residue in the film, to obtain the preparation parts with PEDOT:PSS interface and ITO glass in sequence. Then, the preparation parts with PEDOT:PSS interface and ITO glass in sequence were transferred to a glove box, and a hole transport layer was prepared on the PEDOT:PSS interface according to the method of Step 6 in Examples 1-3 and Comparative examples 1-2, to obtain the preparation parts with the hole transport layer, the PEDOT:PSS interface, and the ITO glass in sequence. Finally, the prepared preparation parts with the hole transport layer, the PEDOT:PSS interface and the ITO glass in sequence were placed into a vacuum coating machine, and a metal Au electrode with a thickness of 30 nm was deposited in a high vacuum environment of less than 5×10-+Pa. After annealing, the test device was obtained.

The compound of formula (I-1) of the present disclosure has a hole mobility of $3.5 \times 10^{-4}$ cm$^2$V$^{-1}$s$^{-1}$, the compound of formula (1-2) has a HOMO energy level of $5.0 \times 10^{-4}$ cm$^2$V$^{-1}$s$^{-1}$, and the compound of formula (I-3) has a HOMO energy level of $2.0 \times 10^{-4}$ cm$^2$V$^{-1}$s$^{-1}$. The commonly used hole transport material spiro-OMeTAD has a hole mobility of $2.4 \times 10^{-5}$ cm$^2$V$^{-1}$s$^{-1}$. The commonly used composition material containing spiro-OMeTAD and additives TBP, Li-TFSI and FK209 has a hole mobility of $3.0 \times 10^{-4}$ cm$^2$V$^{-1}$s$^{-1}$.

3. Determination Method for Valence Band Top Energy Level of Perovskite Layer

A preparation method of a perovskite sample includes: taking a cleaned glass sheet; and prepared according to Step 5 in Example 1 as described above, with the difference residing in that a glass sheet was used instead of the SnO$_2$ layer; and a perovskite film was obtained after annealing.

The ultraviolet photoelectron spectroscopy UPS (AXIS ULTRADLD of Kratos Company) was used to determine the perovskite sample prepared above to obtain the valence band top energy level of perovskite, which was the valence band top energy level of the perovskite layer.

4. Determination Method for Photoelectric Conversion Rate (I-V) of Device

A test of perovskite solar cell (I-V test): a Guangyan solar simulator was used to test in accordance with the national standard IEC61215; a crystalline silicon solar cell was used to correct the intensity of light to achieve a solar intensity, AM 1.5; and the cell was connected to a digital source table, and its photoelectric conversion efficiency was measured under light.

In Table 1, the valence band top energy level of the perovskite layer was expressed as E1; the HOMO energy level of the hole transport layer was expressed as E2; and the difference between the valence band top energy level of the perovskite layer and the HOMO energy level of the hole transport layer was expressed as ΔE=E2−E1.

TABLE 1

| No. | Hole transport layer material | Hole mobility of the hole transport layer (cm$^2$V$^{-1}$s$^{-1}$) | E1(eV) | E2(eV) | ΔE(eV) | Photoelectric conversion efficiency on Day 3 | Photoelectric conversion efficiency on Day 30 |
|---|---|---|---|---|---|---|---|
| Example 1 | I-1 | $3.5 \times 10^{-4}$ | −5.40 | −5.2 | 0.2 | 21.82% | 20.34% |
| Example 2 | I-2 | $5.0 \times 10^{-4}$ | −5.40 | −5.1 | 0.3 | 22.26% | 20.81% |
| Example 3 | I-3 | $2.0 \times 10^{-4}$ | −5.40 | −5.2 | 0.2 | 21.38% | 20.19% |
| Pair scale 1 | spiro-OMeTAD | $2.4 \times 10^{-5}$ | −5.40 | −5.0 | 0.4 | 18.45% | 16.37% |
| Comparative example 2 | spiro-OMeTAD, TBP, Li-TFSI and FK209 | $3.0 \times 10^{-4}$ | −5.40 | −5.1 | 0.3 | 20.54% | 12.89% |

Compared with Comparative examples 1 and 2, Examples 1 to 3 of the present disclosure have achieved higher photoelectric conversion efficiency and better stability.

Compared with the commonly used hole transport material spiro-OMeTAD, the compound of formula (I) of the present disclosure has a deeper HOMO energy level and a higher hole mobility, which are achieved by changing the arrangement of four triphenylamine groups in the molecule. Correspondingly, the same is true for the hole transport layer. The hole transport layer formed from the compound of formula (I) also has a deeper HOMO energy level and higher hole mobility, as shown in Table 1. It can be seen that the difference (absolute value) between the HOMO energy level of the compound of the present disclosure and the HOMO energy level of the perovskite layer is smaller, which is more suitable for matching with the perovskite layer formed from plumbum iodide, formamidine iodide, cesium iodide, methylammonium bromide, and plumbum bromide.

Compared with the commonly used composition materials including spiro-OMeTAD and additives TBP, Li-TFSI and FK209, the compound of formula (I) of the present disclosure has a comparable HOMO energy level and hole mobility or has a certain degree of improvement. Correspondingly, the same is true for the hole transport layer, as shown in Table 1. Further, the perovskite solar cell made of the compound of formula (I) of the present disclosure has significantly improved photoelectric conversion efficiency and long-term stability.

It should be noted that the present disclosure is not limited to the above embodiments. The above embodiments are only illustrative, and embodiments that have the same composition and effect as the technical idea within the scope of the technical solutions of the present disclosure are all included in the technical scope of the present disclosure. Further, within the scope of the subject matter of the present disclosure, various modifications applied to the embodiments that can be thought of by those skilled in the art, and other embodiments constructed by combining some constituent elements of the embodiments are also included in the scope of the present disclosure.

What is claimed is:

1. A compound having a structure of formula (I),

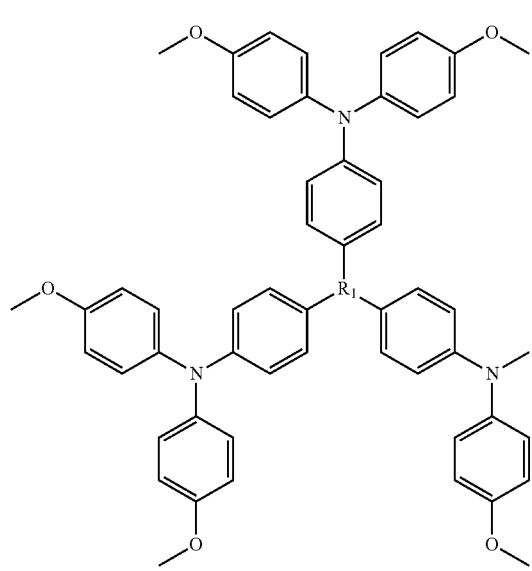
(I)

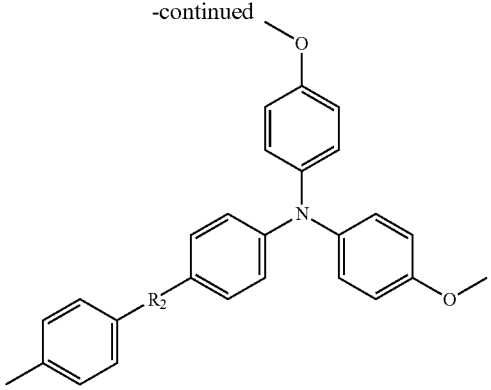

wherein R1 is trivalent phenyl, optionally 1,3,4-benzenetriyl;

R2 is a single bond, $C_2$-$C_6$ conjugated alkenylene or an unsaturated 5-membered or 6-membered ring group containing heteroatoms selected from O, S, or Se; and optionally, R2 is single bond vinylidene furylidene thiophenylene or selenophenylene.

2. The compound according to claim 1, wherein the compound of formula (I) is a compound of formula (I-1), formula (I-2) or formula (I-3),

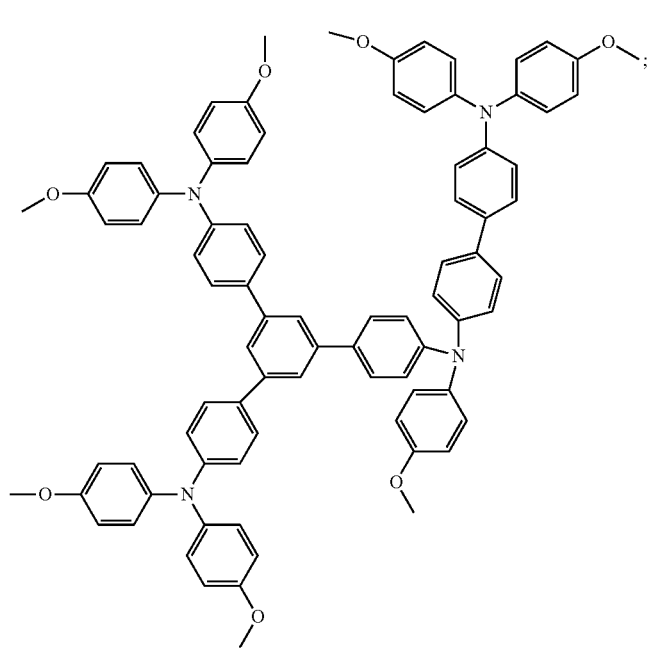
(I-1)

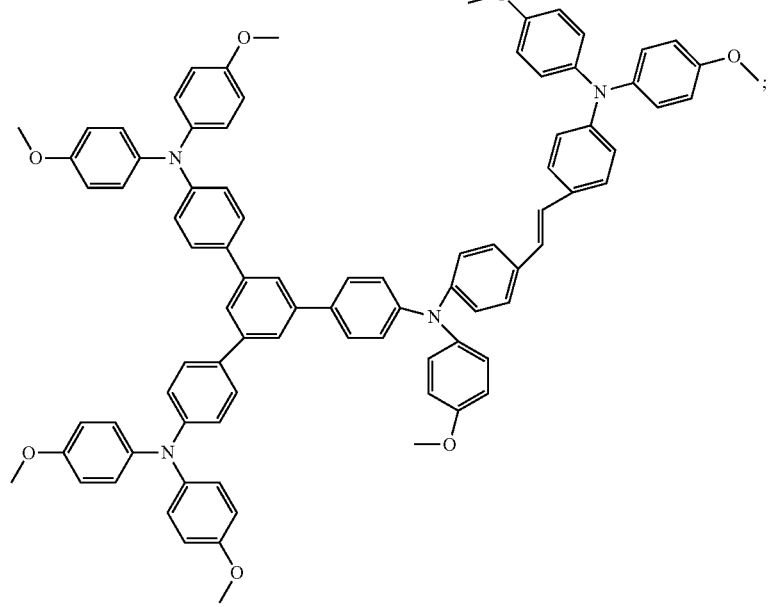
(I-2)
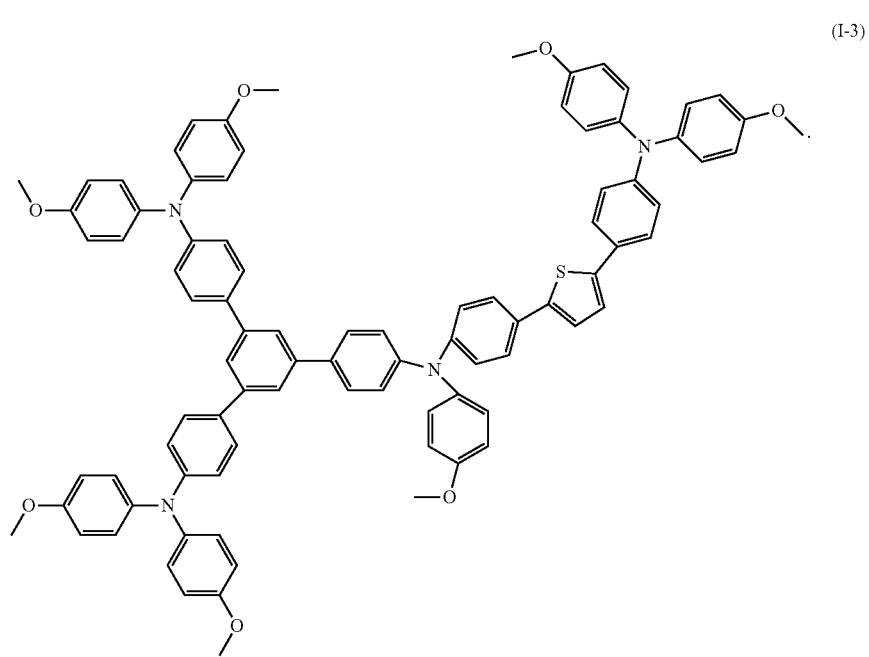
(I-3)

3. The compound according to claim 1, wherein the compound has a HOMO energy level ranging from −5.05 eV to −5.30 eV, optionally ranging from −5.1 eV to −5.2 eV, and a charge mobility ranging from $1.0 \times 10^{-4}$ $cm^2 V^{-1} s^{-1}$ to $8.0 \times 10^{-4}$ $cm^2 V^{-1} s^{-1}$, optionally ranging from $2.0 \times 10^{-4}$ $cm^2 V^{-1} s^{-1}$ to $6.0 \times 10^{-4}$ $cm^2 V^{-1} s^{-1}$.

4. A method for preparing a compound according to claim 1, comprising the steps of:

1) Preparing a compound of formula (II):

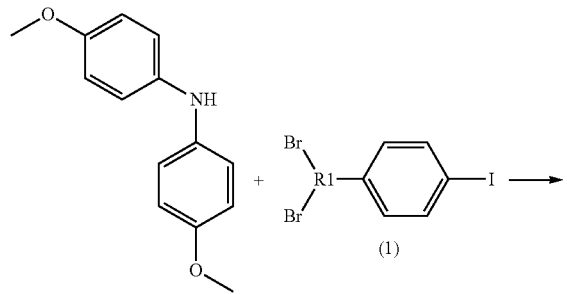

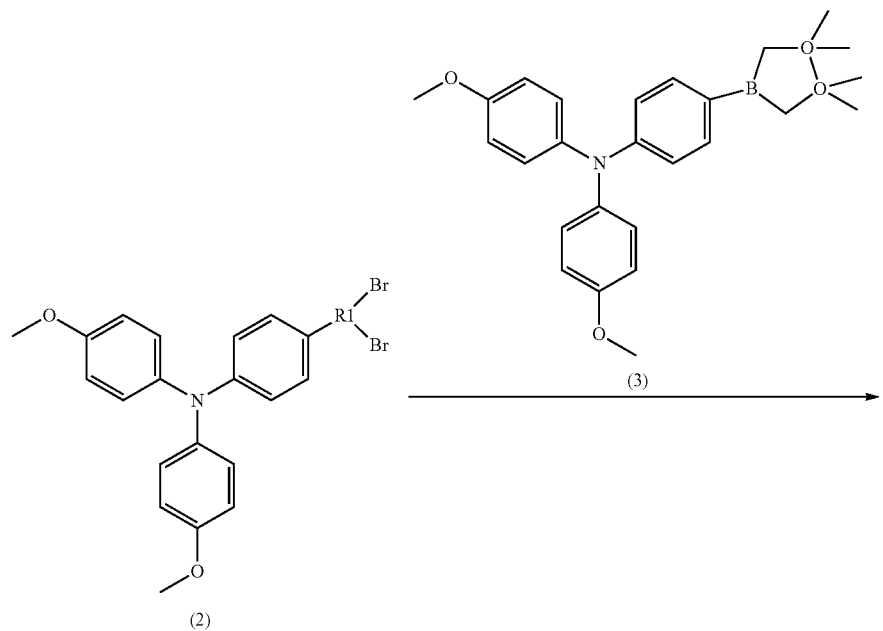

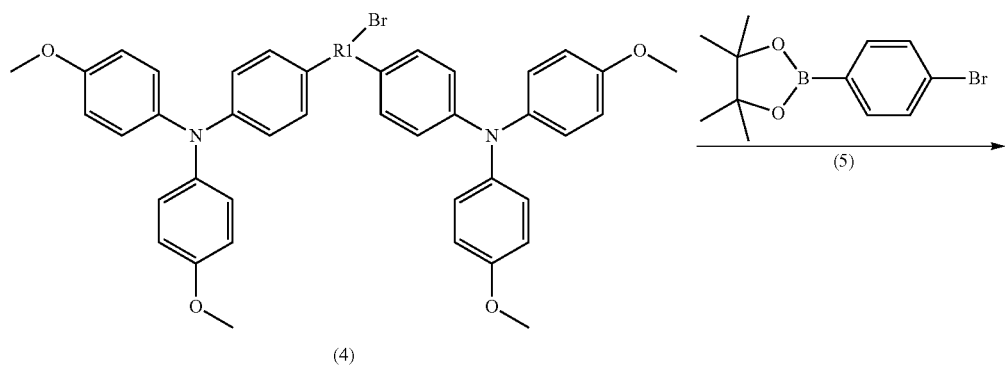

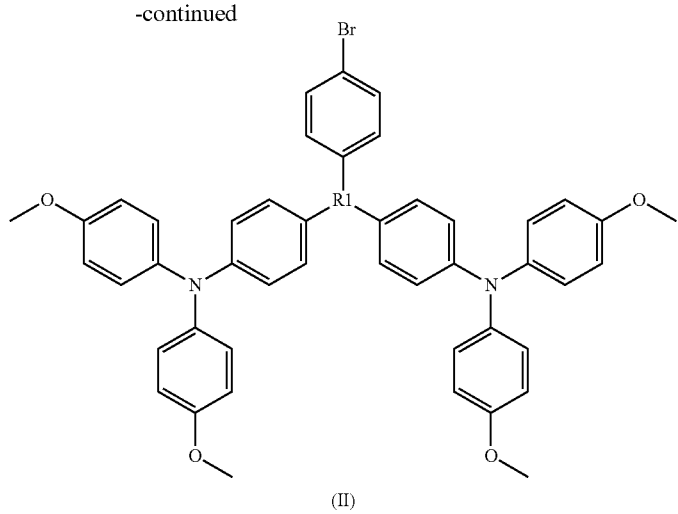

(II)

coupling reaction of 4,4'-dimethoxydiphenylamine and an iodobenzene dibromide of formula (1) to form an intermediate (2), coupling reaction of the intermediate (2) and 4-borate-4',4'-dimethoxytriphenylamine of formula (3) to generate an intermediate (4), and coupling reaction of the intermediate (4) and 2-(4-bromophenyl)-4,4,5,5-tetramethyl-1,3,2-dioxaborolane of formula (5) to obtain the compound of formula (II);

2) Preparing a compound of formula (III):

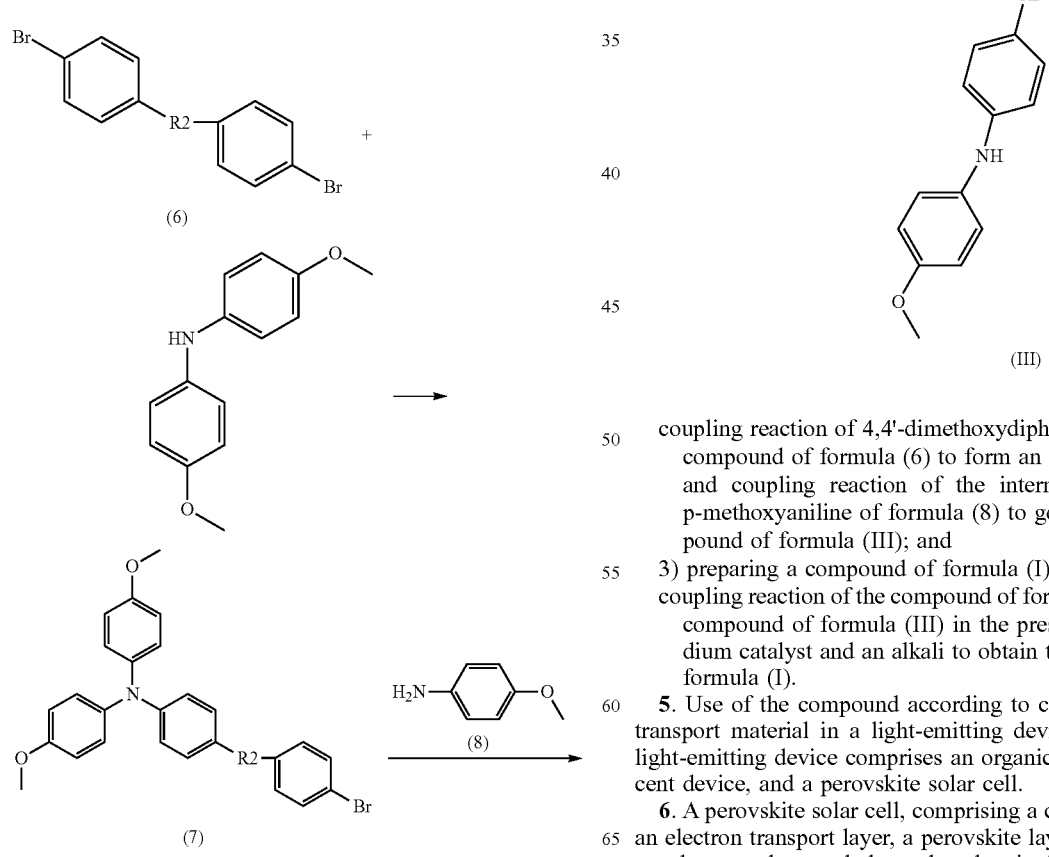

(III)

coupling reaction of 4,4'-dimethoxydiphenylamine and a compound of formula (6) to form an intermediate (7), and coupling reaction of the intermediate (7) and p-methoxyaniline of formula (8) to generate the compound of formula (III); and 3) preparing a compound of formula (I):
coupling reaction of the compound of formula (II) and the compound of formula (III) in the presence of a palladium catalyst and an alkali to obtain the compound of formula (I).

5. Use of the compound according to claim 1 as a hole transport material in a light-emitting device, wherein the light-emitting device comprises an organic electroluminescent device, and a perovskite solar cell.

6. A perovskite solar cell, comprising a conductive glass, an electron transport layer, a perovskite layer, a hole transport layer, and a metal electrode, wherein the hole transport layer comprises the compound according to claim 1.

7. The perovskite solar cell according to claim 6, wherein the hole transport layer contains no additives selected from lithium salts, cobalt salts, or co-solvents, including one or more of bis(trifluoromethane) sulfonimide lithium salt, cobalt-base(III) bis-trifluoromethane sulfonimide salt, and 4-tert-butylpyridine.

8. The perovskite solar cell according to claim 6, wherein the bole transport layer has a HOMO energy level ranging from −5.05 eV to −5.30 eV optionally ranging from −5.10 eV to −5.20 eV; and the perovskite layer has a valence band top energy level ranging from −5.30 eV to −5.60 eV, optionally ranging from −5.30 eV to −3.50 eV.

9. The perovskite solar cell according to claim 6, wherein the HOMO energy level of the hole transport layer is greater than a valence band top energy level of the perovskite layer, with an energy level difference ranging from 0.35 eV to 0.05 eV, optionally ranging from 0.3 eV to 0.2 eV.

10. The perovskite solar cell according to claim 6, wherein the hole transport layer has a thickness ranging from 5 nm to 100 nm, optionally ranging from 30 nm to 80 nm.

11. A method for preparing the perovskite solar cell according to claim 6, comprising the steps for a hole transport layer:
   dissolving the compound in an organic solvent to prepare a solution of a hole transport material; and
   coating the solution of the hole transport material onto the surface of the perovskite layer, and removing the solvent to obtain the hole transport laver,
   wherein, when the perovskite solar cell is a forward perovskite solar cell, the concentration of the compound in the solution of the hole transport material ranges from 20 mg/mL to 100 mg/ml; when the perovskite solar cell is an inverted perovskite solar cell, the concentration of the compound in the solution of the hole transport material ranges from 1 mg/ml to 50 mg/ml; and
   wherein the organic solvent is toluene, chlorobenzene or dichloromethane.

* * * * *